(12) United States Patent
Murayama et al.

(10) Patent No.: US 7,091,464 B2
(45) Date of Patent: Aug. 15, 2006

(54) IMAGE SENSOR

(75) Inventors: Jin Murayama, Miyagi (JP); Makoto Shizukuishi, Miyagi (JP); Tetsuo Yamada, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 378 days.

(21) Appl. No.: 10/420,708

(22) Filed: Apr. 23, 2003

(65) Prior Publication Data
US 2003/0226953 A1  Dec. 11, 2003

(30) Foreign Application Priority Data
Apr. 23, 2002 (JP) .......................... P. 2002-120674
Jun. 24, 2002 (JP) .......................... P. 2002-182947

(51) Int. Cl.
*H04N 5/335* (2006.01)
(52) U.S. Cl. .................... 250/208.1; 250/226
(58) Field of Classification Search ............ 250/208.1, 250/226; 257/232; 348/315
See application file for complete search history.

(56) References Cited

U.S. PATENT DOCUMENTS 6,522,356 B1 * 2/2003 Watanabe .................... 348/272
6,806,904 B1 * 10/2004 Kim ........................... 348/315

* cited by examiner

*Primary Examiner*—Thanh X. Luu
(74) *Attorney, Agent, or Firm*—Birch, Stewart, Kolasch & Birch, LLP

(57) ABSTRACT

A linear image sensor is constituted to include a red diode line 11, a green diode line 12 and a blue diode line 13, and the green diode line 12 positioned between the red diode line 11 and the blue diode line 13 is provided with a shift of an approximately ½ pitch in the vertical direction of a photodiode as shown. Electric charge transfer channels 21, 22 and 23 for transferring signal charges detected by the photodiodes are formed close to the red diode line 11, the green diode line 12 and the blue diode line 13 respectively, and take a winding shape extended in a main scanning direction. Signal charges read onto the electric charge transfer channels 21, 22 and 23 are transferred in the main scanning direction and are output from output ends OUT31, OUT32 and OUT33.

44 Claims, 29 Drawing Sheets

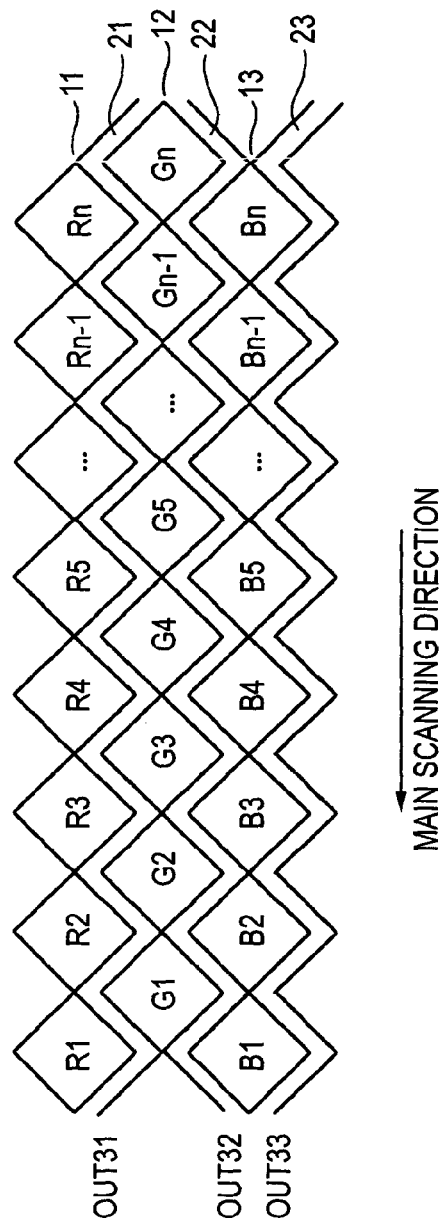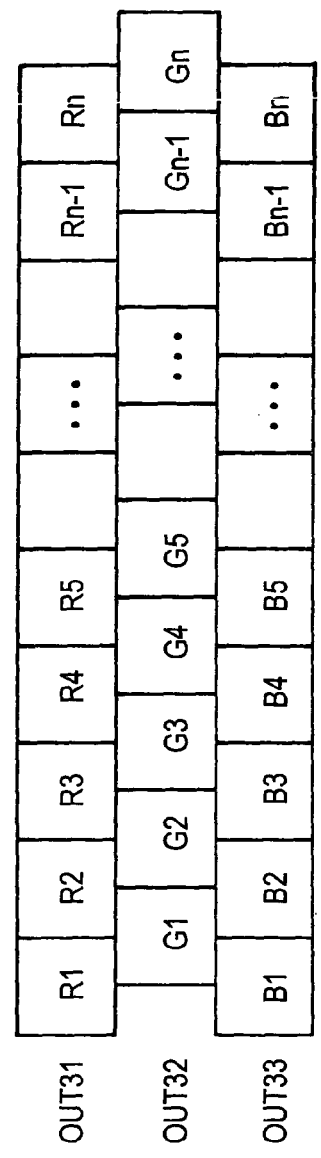

FIG. 3 (a)

| R | G | B |
|---|---|---|
| $\frac{R1+R2}{2}$ | G1 | $\frac{B1+B2}{2}$ |
| $\frac{R2+R3}{2}$ | G2 | $\frac{B2+B3}{2}$ |
| $\frac{R3+R4}{2}$ | G3 | $\frac{B3+B4}{2}$ |
| $\frac{R4+R5}{2}$ | G4 | $\frac{B4+B5}{2}$ |
| $\frac{R5+R6}{2}$ | G5 | $\frac{B5+B6}{2}$ |
| ⋮ | ⋮ | ⋮ |
| $\frac{R_{n-1}+R_n}{2}$ | $G_{n-1}$ | $\frac{B_{n-1}+B_n}{2}$ |
| $R_n$ | $G_n$ | $B_n$ |

FIG. 3 (b)

| R | G | B |
|---|---|---|
| R1 | G1 | B1 |
| R2 | $\frac{G1+G2}{2}$ | B2 |
| R3 | $\frac{G2+G3}{2}$ | B3 |
| R4 | $\frac{G3+G4}{2}$ | B4 |
| R5 | $\frac{G4+G5}{2}$ | B5 |
| ⋮ | ⋮ | ⋮ |
| $R_{n-1}$ | $\frac{G_{n-2}+G_{n-1}}{2}$ | $B_{n-1}$ |
| $R_n$ | $\frac{G_{n-1}+G_n}{2}$ | $B_n$ |

| R | R1a | R1b | R2a | R2b | R3a | R3b | R4a | R4b | R5a | R5b | ⋮ | ⋮ | ⋮ | ⋮ | ⋮ | ⋮ | ⋮ | ⋮ | ⋮ | ⋮ | ⋮ | ⋮ | Rna | Rnb |
|---|---|---|---|---|---|---|---|---|---|---|---|---|---|---|---|---|---|---|---|---|---|---|---|---|
| G | G1a | G1b | G2a | G2b | G3a | G3b | G4a | G4b | G5a | G5b | ⋮ | ⋮ | ⋮ | ⋮ | ⋮ | ⋮ | ⋮ | ⋮ | ⋮ | ⋮ | ⋮ | ⋮ | Gna | Gnb |
| B | B1a | B1b | B2a | B2b | B3a | B3b | B4a | B4b | B5a | B5b | ⋮ | ⋮ | ⋮ | ⋮ | ⋮ | ⋮ | ⋮ | ⋮ | ⋮ | ⋮ | ⋮ | ⋮ | Bna | Bnb |

FIG. 10

| R | R1a+R1b | R2a+R2b | R3a+R3b | | | ⋮ | | | | Rna+Rnb |
|---|---|---|---|---|---|---|---|---|---|---|
| G | G1a+G1b | G2a+G2b | G3a+G3b | | | ⋮ | | | | Gna+Gnb |
| B | B1a+B1b | B2a+B2b | B3a+B3b | | | ⋮ | | | | Bna+Bnb |

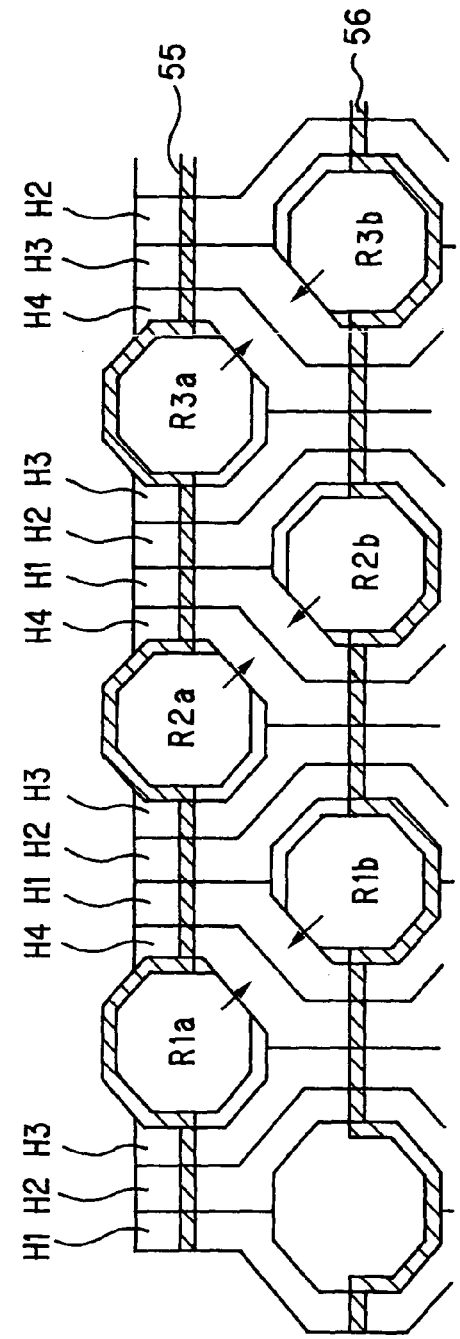

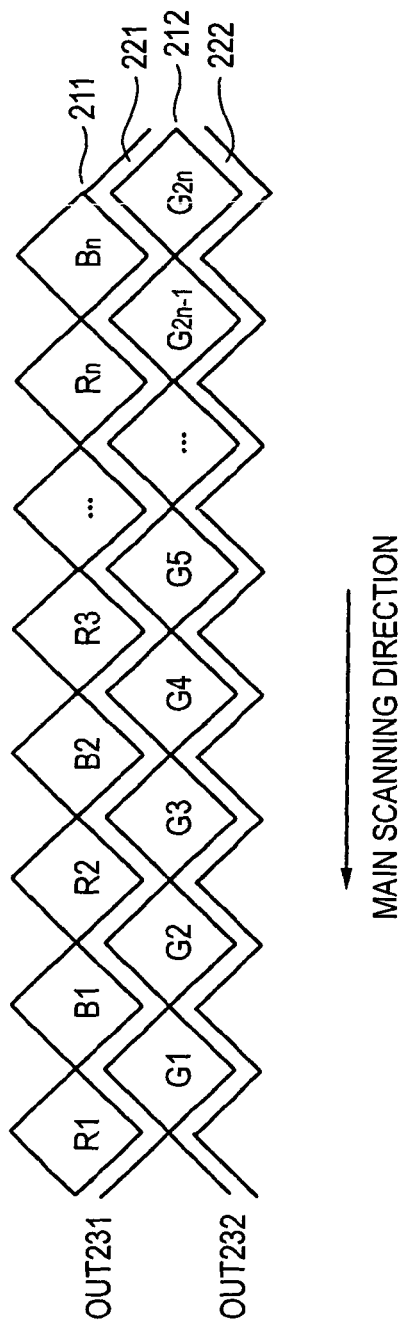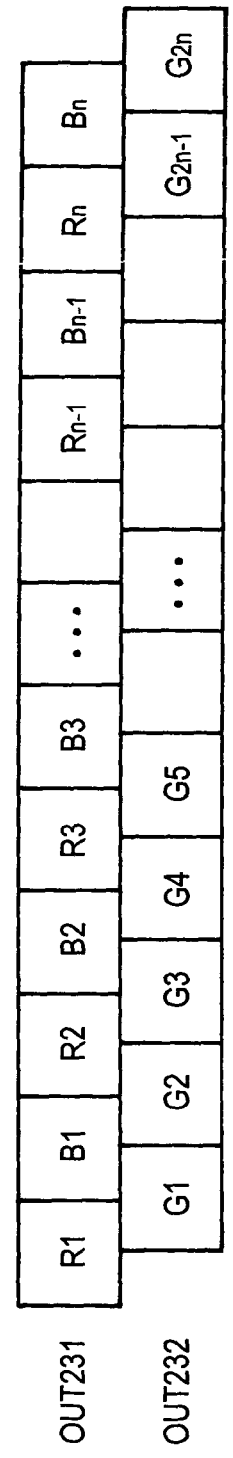

FIG. 17

| R | R1 | $\frac{R1+R2}{2}$ | R2 | $\frac{R2+R3}{2}$ | R3 | $\frac{R3+R4}{2}$ | ... | $R_{n-1}$ | $\frac{R_{n-1}+R_n}{2}$ | $R_n$ | $R_n$ |
|---|---|---|---|---|---|---|---|---|---|---|---|
| G | G1 | G2 | G3 | G4 | G5 | G6 | ... | $G_{2n-3}$ | $G_{2n-2}$ | $G_{2n-1}$ | $G_{2n}$ |
| B | B1 | B1 | $\frac{B1+B2}{2}$ | B2 | $\frac{B2+B3}{2}$ | B3 | $\frac{B3+B4}{2}$ | ... | $\frac{B_{n-2}+B_{n-1}}{2}$ | $B_{n-1}$ | $\frac{B_{n-1}+B_n}{2}$ | $B_n$ |

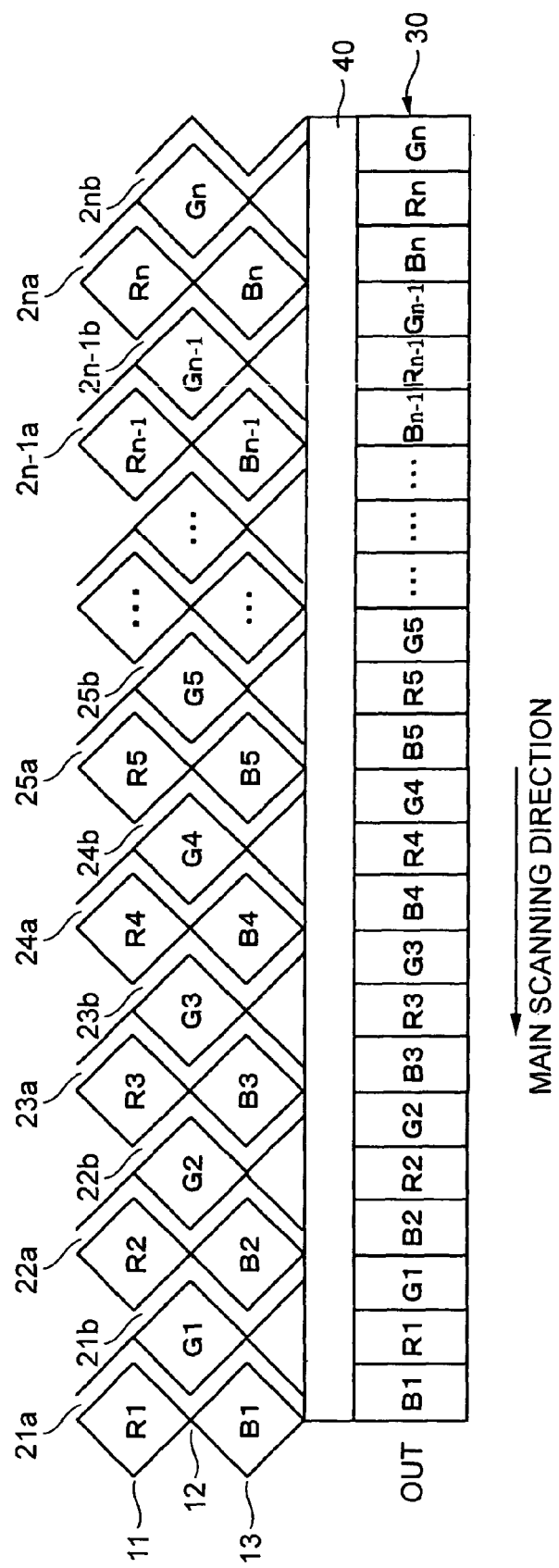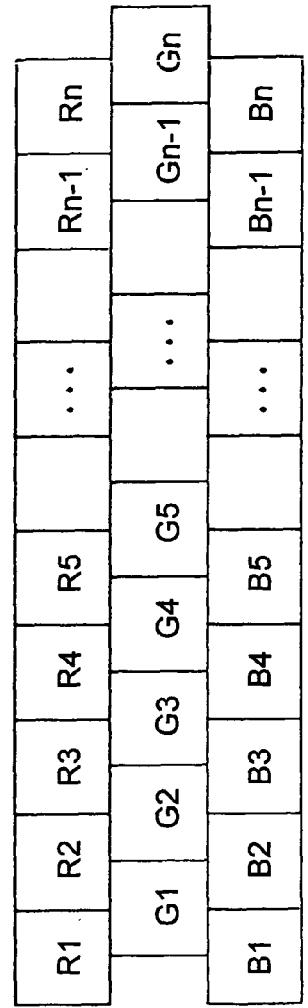

↘ ↘ : CHARGE READ-OUT GATE SECTION

FIG. 32

| R1c | G1b | B1b | G1a | R1a | B2c | G2b | R2b | G2a | B2a | R3c | G3b | B3b | G3a | R3a | ... | ... | ... | Rnc | Gnb | Bnb | Gna | Rna |

FIG. 33

| R1c | B1b | R1a | G1b | G1a | B2c | R2b | B2a | G2b | G2a | R3c | B3b | R3a | G3b | G3a | ... | ... | ... | Rnc | Bnb | Rna | Gnb | Gna |

FIG. 34

| R | | | | | | | | | | |
|---|---|---|---|---|---|---|---|---|---|---|
| R1a | B2a | R3a | B4a | R5a | ... | | | | Rn-1a | Bna |

| G | | | | | | | | | | |
|---|---|---|---|---|---|---|---|---|---|---|
| G1a | G2a | G3a | G4a | G5a | ... | | | | Gn-1a | Gna |

| | B1b | R2b | B3b | R4b | B5b | ... | | | Bn-1b | Rnb |

| | G1b | G2b | G3b | G4b | G5b | ... | | | Gn-1b | Gnb |

| R1c | B2c | R3c | B4c | R5c | ... | | | | Rn-1c | Bnc |

FIG. 35

R: R1a+2*R2b+R1c, R3a+2*R4b+R3c, ..., Rn-1a+2*Rnb+Rn-1c

G: G1a+G1b, G2a+G2b, G3a+G3b, G4a+G4b, ..., Gn-1a+Gn-1b, Gna+Gnb

B: 2*B1b+B2c, B2a+2*B3b+B4c, ..., 2*Bn-1b+Bnc, Bna+Bnc

|   | R1 | R2 | R3 | R4 | R5 | ... | Rn-1 | Rn |
|---|----|----|----|----|----|-----|------|-----|
| 541 | | | | | | | | |

|   | G1 | G2 | G3 | G4 | G5 | ... | Gn-1 | Gn |
|---|----|----|----|----|----|-----|------|-----|
| 542 | | | | | | | | |

|   | B1 | B2 | B3 | B4 | B5 | ... | Bn-1 | Bn |
|---|----|----|----|----|----|-----|------|-----|
| 543 | | | | | | | | |

*FIG. 37 (a)*

| R | R1 | R2 | R3 | R4 | R5 | ... | Rn-1 | Rn |
|---|----|----|----|----|----|-----|------|-----|
| G | G1 | G2 | G3 | G4 | G5 | ... | Gn-1 | Gn |
| B | B1 | B2 | B3 | B4 | B5 | ... | Bn-1 | Bn |

*FIG. 37 (b)*

| | | | | | | | | |
|---|---|---|---|---|---|---|---|---|
| R1 | B1 | R2 | B2 | R3 | B3 | ... | Rn | Bn |
| G1 | G2 | G3 | G4 | G5 | G6 | ... | G$_{2n-1}$ | G$_{2n}$ |

| | | | | | | | | |
|---|---|---|---|---|---|---|---|---|
| R1 | $\frac{R1+R2}{2}$ | R2 | $\frac{R2+R3}{2}$ | R3 | $\frac{R3+R4}{2}$ | ... | Rn | Rn |
| G1 | G2 | G3 | G4 | G5 | G6 | ... | G$_{2n-1}$ | G$_{2n}$ |
| B1 | B1 | $\frac{B1+B2}{2}$ | B2 | $\frac{B2+B3}{2}$ | B3 | ... | $\frac{B_{n-1}+B_n}{2}$ | Bn |

IMAGE SENSOR

BACKGROUND OF THE INVENTION

1. Field of the Invention

The present invention relates to a linear image sensor including a photoelectric converting device line in which a photoelectric converting device is linearly provided on a semiconductor, and more particularly to a suitable linear image sensor for color photographing including a plurality of photoelectric converting device lines.

2. Description of the Related Art

A linear image sensor to be utilized in various apparatuses such as a facsimile, an electronic copying machine, an image scanner and a bar code reader has an image pick-up section formed on a semiconductor substrate. The image pick-up section includes a photoelectric converting device line in which a photoelectric converting device such as a photodiode is provided almost linearly and an electric charge transfer section formed close to the photoelectric converting device line. The electric charge transfer section includes an electric charge transfer channel for transferring a signal charge detected by the photoelectric converting device and a plurality of electric charge transfer electrodes for controlling a signal charge transfer. The signal charge transferred by the electric charge transfer section is sent to an output section such as a floating diffusion amplifier and is output as a voltage signal.

In a linear image sensor for color image pick-up, color filters of red, green and blue are formed on the photoelectric converting devices and the photoelectric converting devices detect signal charges corresponding to a red color, a green color and a blue color, respectively.

FIG. 36 shows a schematic structure according to an example of the image pick-up section of a conventional linear image sensor for color image pick-up. A linear image sensor in FIG. 36 is provided with three photodiode lines 511, 512 and 513 having an almost rectangular photodiode 500 arranged linearly, and electric charge transfer sections 521, 522 and 523 are juxtaposed with the photodiode lines 511, 512 and 513, respectively. Output sections 531, 532 and 533 including a floating diffusion amplifier are formed on the ends of the electric charge transfer sections 521, 522 and 523, and a voltage corresponding to a signal charge detected by the photodiode 500 is output from each of the output terminals 541, 542 and 543.

The photodiode lines 511, 512 and 513 output signals corresponding to a red light, a green light and a blue light, respectively. More specifically, a red filter (not shown) is provided in each photodiode forming the photodiode line 511, a green filter (not shown) is provided in each photodiode forming the photodiode line 512 and a blue filter (not shown) is provided in each photodiode forming the photodiode line 513.

Accordingly, a signal shown in FIG. 37(a) is output from each of the output terminals 541, 542 and 543, and therefore, can be utilized as a color image pick-up signal shown in FIG. 37(b) after an AD conversion and other processings are carried out. The symbols R1, R2, . . . , Rn, G1, G2, . . . , Gn, B1, B2, . . . , Bn in FIG. 37 indicate signals detected by photodiodes having the symbols R1, R2, . . . , Rn, G1, G2, . . . , Gn, B1, B2, . . . , Bn in FIG. 36 and so is the following description.

In the linear image sensor shown in FIG. 36, however, it is necessary to provide the electric charge transfer sections 521 and 522 between the photodiode lines 511 and 512 and between the photodiode lines 512 and 513. For this reason, a spacing between the photodiode lines 511, 512 and 513 cannot be reduced. In order to pick up an image having a high resolution, therefore, precision in a position in such a direction (hereinafter referred to as a subscanning direction in some cases) as to cross the direction of arrangement of the photodiode lines 511, 512 and 513 (hereinafter referred to as a main scanning direction in some cases). The precision in the subscanning direction depends on the mechanical precision of a subscanning mechanism and it is generally hard to inexpensively obtain a mechanism with high precision.

FIG. 38 is a view showing a schematic structure according to another example of the image pick-up section of a conventional linear image sensor for color image pick-up. The linear image sensor shown in FIG. 38 is provided with two photodiode lines 611 and 612 having an almost rectangular photodiode 600 arranged linearly. The photodiode lines 611 and 612 are provided close to each other, and electric charge transfer sections 621 and 622 are provided on the outside of the photodiode lines 611 and 612. Moreover, output sections 631 and 632 including a floating diffusion amplifier are formed on the ends of the electric charge transfer sections 621 and 622 and a voltage corresponding to a signal charge detected by the photodiode 600 is output from each of the output terminals 641 and 642.

A red filter and a blue filter (not shown) are alternately provided in each photodiode forming the photodiode line 611, and a green filter (not shown) is provided in each photodiode forming the photodiode line 612.

Accordingly, a signal shown in FIG. 39(a) is output from each of the output terminals 641 and 642, and therefore, can be utilized as a color image pick-up signal shown in FIG. 39(b) by the execution of an operation for a color signal after an AD conversion and other processings are carried out.

In the linear image sensor shown in FIG. 38, the photodiode lines 611 and 612 are provided close to each other. Therefore, the mechanical precision of a subscanning mechanism is not always required. However, it is hard to provide horizontal transfer electrodes H1, H2 . . . . More specifically, if the number of the photodiode lines is increased to enhance a detection sensitivity, the electric charge transfer section is provided in the photodiode line. Consequently, a resolution is deteriorated.

SUMMARY OF THE INVENTION

In consideration of the circumstances, it is an object of the invention to provide a linear image sensor capable of carrying out photographing with a high resolution and a high sensitivity without requiring a mechanical mechanism having high precision.

The invention provides a linear image sensor including a plurality of photoelectric converting device lines, each of which has a plurality of photoelectric converting devices provided linearly on a semiconductor substrate, comprising an electric charge transfer section for transferring an electric charge from the photoelectric converting device, and an output section for outputting a signal corresponding to an electric charge transferred by the electric charge transfer section, wherein the photoelectric converting devices included in the adjacent photoelectric converting device lines are provided with a shift of an approximately ½ pitch between the photoelectric converting devices in the photoelectric converting device line in a vertical direction from each other, the electric charge transfer section includes an electric charge transfer channel formed on the semiconductor substrate corresponding to each of the photoelectric converting device lines and a plurality of electric charge transfer electrodes formed to cross each of the electric charge transfer channels as seen on a plane, and the electric charge transfer channel is formed close to the photoelectric converting device to take a winding shape extended in a vertical direction of the photoelectric converting device as a whole. With such a structure, a gap between the photoelectric converting device lines can be reduced and precision in detection in a subscanning direction which is almost orthogonal to the vertical direction as a whole can be enhanced. Accordingly, it is possible to pick up an image with high precision even if the tolerance of precision in mechanical subscanning is increased.

In the linear image sensor according to the invention, the electric charge transfer electrode is formed between the photoelectric converting devices to take a winding shape extended in such a direction as to cross the vertical direction of the photoelectric converting device as a whole. Thus, the transfer electrode corresponding to the photoelectric converting devices of the photoelectric converting device lines can be formed integrally and a wiring for transfer pulse supply for the transfer electrode can simply be formed.

In the linear image sensor according to the invention, four electric charge transfer electrodes are provided corresponding to the photoelectric converting devices, respectively.

In the linear image sensor according to the invention, moreover, the photoelectric converting device line includes photoelectric converting devices for detecting electric charges corresponding to specific single color lights, respectively.

In the linear image sensor according to the invention, a plurality of photoelectric converting device lines are provided corresponding to the same single color light. With such a structure, it is possible to enhance a resolution in a main scanning direction and to increase a detection sensitivity.

In the linear image sensor according to the invention, moreover, an even number of photoelectric converting device lines corresponding to the same single color light are provided adjacently to each other, and electric charge transfer paths corresponding to two of the adjacent photoelectric converting device lines corresponding to the same single color light are connected on this side of the output section.

In the linear image sensor according to the invention, furthermore, an even number of photoelectric converting device lines corresponding to the same single color light are provided adjacently to each other, and the electric charge transfer section is provided between two of the adjacent photoelectric converting device lines corresponding to the same single color light so as to be used in the two adjacent lines. It is possible to read the signal charges which are added and to increase a detection sensitivity with a simpler structure.

In the linear image sensor according to the invention, moreover, the single color light has three kinds of lights, that is, a red light, a green light and a blue light.

In the linear image sensor according to the invention, the photoelectric converting device line has a single color light photoelectric converting device line including photoelectric converting devices for detecting an electric charge corresponding to one single color light and a plural color light photoelectric converting device line including photoelectric converting devices for detecting electric charges corresponding to other single color lights, respectively.

In the linear image sensor according to the invention, moreover, the single color light photoelectric converting device line and the plural color light photoelectric converting device line are arranged alternately, and the number of the plural color light photoelectric converting device lines is greater than that of the single color light photoelectric converting device lines.

In the linear image sensor according to the invention, furthermore, the single color light is a green light, and the other single color lights include a red color and a blue color, and the photoelectric converting device for the red light and the photoelectric converting device for the blue light are arranged alternately in a vertical direction.

The invention provides a linear image sensor including a plurality of photoelectric converting device lines, each of which has a plurality of photoelectric converting devices provided linearly on a semiconductor substrate, comprising a first electric charge transfer section for transferring an electric charge from the photoelectric converting device in such a direction as to cross a vertical direction of the photoelectric converting device, a second electric charge transfer section for transferring an electric charge from the first electric charge transfer section in the vertical direction of the photoelectric converting device, and an output section for outputting a signal corresponding to an electric charge transferred by the second electric charge transfer section, wherein the photoelectric converting devices included in the adjacent photoelectric converting device lines are provided with a shift of an approximately ½ pitch between the photoelectric converting devices in the photoelectric converting device line in the vertical direction of the photoelectric converting device from each other, the first electric charge transfer section includes a first electric charge transfer channel formed on the semiconductor substrate corresponding to the photoelectric converting devices included in at least one photoelectric converting device line and a plurality of first electric charge transfer electrodes formed to cross each of the electric charge transfer channels as seen on a plane, and the first electric charge transfer channel is formed close to the photoelectric converting device to take a winding shape extended in such a direction as to cross the vertical direction of the photoelectric converting device as a whole. With such a structure, a gap between the photoelectric converting device lines can be reduced and precision in detection in a subscanning direction which is almost orthogonal to the vertical direction as a whole can be enhanced. Accordingly, it is possible to pick up an image with high precision even if the tolerance of precision in mechanical subscanning is increased.

In the linear image sensor according to the invention, the first electric charge transfer electrode is formed between the photoelectric converting devices to take a winding shape extended in the vertical direction of the photoelectric converting device as a whole. Thus, the first electric charge transfer electrode corresponding to the photoelectric converting devices of the photoelectric converting device lines can be formed integrally and a wiring for transfer pulse supply for the transfer electrode can simply be formed.

In the linear image sensor according to the invention, four first electric charge transfer electrodes are provided corresponding to the photoelectric converting devices, respectively.

In the linear image sensor according to the invention, moreover, the photoelectric converting device line includes photoelectric converting devices for detecting electric charges corresponding to specific single color lights, respectively.

In the linear image sensor according to the invention, a plurality of photoelectric converting device color lights are provided corresponding to the same single color light. With such a structure, it is possible to enhance a resolution in a main scanning direction and to increase a detection sensitivity.

In the linear image sensor according to the invention, furthermore, an even number of photoelectric converting device lines corresponding to the single color light are provided adjacently for the same single color light. With such a structure, it is possible to decrease the number of the first electric charge transfer sections. Moreover, the signal charge can be added within the first electric charge transfer section. Therefore, it is possible to decrease the number of stages of the second electric charge transfer section and to increase the detection sensitivity.

In the linear image sensor according to the invention, moreover, the single color light has three kinds of lights, that is, a red light, a green light and a blue light.

In the linear image sensor according to the invention, the photoelectric converting device line includes a single color light photoelectric converting device line including photoelectric converting devices for detecting an electric charge corresponding to one single color light and a plural color light photoelectric converting device line including photoelectric converting devices for detecting electric charges corresponding to other single color lights, respectively.

In the linear image sensor according to the invention, moreover, the single color light photoelectric converting device line and the plural color light photoelectric converting device line are arranged alternately, and the number of the plural color light photoelectric converting device lines is greater than that of the single color light photoelectric converting device lines.

In the linear image sensor according to the invention, furthermore, the single color light is a green light, and the other single color lights include a red color and a blue color, and the photoelectric converting device for the red light and the photoelectric converting device for the blue light are arranged alternately in a vertical direction.

BRIEF DESCRIPTION OF THE DRAWINGS

FIG. 1 is a view showing the schematic structure of a part of the image pick-up section of a linear image sensor according to a first embodiment, FIG. 2 is a view showing an output color signal in the linear image sensor according to the first embodiment, FIGS. 3(a) and 3(b) show the views showing the color image signals obtained by an operation from the output color signal in the linear image sensor according to the first embodiment, FIG. 8 is a view showing an output color signal in the linear image sensor according to the second embodiment, FIG. 9 is a view showing an example of a color image signal obtained by an operation from the output color signal in the linear image sensor according to the second embodiment, FIG. 10 is a view showing another example of the color image signal obtained by an operation from the output color signal in the linear image sensor according to the second embodiment, FIG. 12 is a view showing an output color signal in the linear image sensor according to the third embodiment, FIG. 13 is a view showing, in detail, a part of the image pick-up section of the linear image sensor according to the third embodiment, FIG. 15 is a view showing, in detail, a part of the image pick-up section of a linear image sensor according to a fourth embodiment.

FIG. 16 is a view showing an output color signal in the linear image sensor according to the fourth embodiment.

FIG. 17 is a view showing the color image signals obtained by an operation from the output color signal in the linear image sensor according to the fourth embodiment.

FIG. 18 is a view showing the schematic structure of a part of the image pick-up section of a linear image sensor according to a fifth embodiment, FIG. 19 is a view showing a correspondence relationship between an output color signal and a detection position in the linear image sensor according to the fifth embodiment, FIGS. 23(a) and 23(b) show the views showing the relative positions in a horizontal transfer channel for a signal charge in the linear image sensor according to the fifth embodiment, FIG. 25 is a view showing a relative position in a horizontal transfer channel for a signal charge in the linear image sensor according to the sixth embodiment, FIG. 26 is a view showing a correspondence relationship between an output color signal and a detection position in the linear image sensor according to the sixth embodiment, FIGS. 32 and 33 show examples of the signal charges read into the horizontal transfer channel of the linear image sensor according to the ninth embodiment.

FIG. 34 is a view showing a correspondence relationship between an output color signal and a detection position in the linear image sensor according to the ninth embodiment, FIG. 35 is a view showing the color image signals obtained by an operation from the output color signal in the linear image sensor according to the ninth embodiment, FIG. 37(a) is a view showing an output color signal in the conventional linear image sensor, FIG. 37(b) is a view showing the color image signals obtained by an operation from the conventional linear image signal, FIG. 39(a) is a view showing an outpt color signal of the another conventional linear image sensor, and FIG. 39(b) is a view showing the color image signals obtained by an operation from the another conventional linear image signal.

DESCRIPTION OF THE PREFERRED EMBODIMENTS

Embodiments of the invention will be described with reference to FIGS. 1 to 20.

First Embodiment

FIG. 1 shows the schematic structure of a part of the image pick-up section of a linear image sensor according to a first embodiment. The linear image sensor in FIG. 1 is constituted to include photodiodes R1, R2, . . . , Rn-1 and Rn (a red diode line 11) for red light detection, photodiodes G1, G2, . . . , Gn-1 and Gn (a green diode line 12) for green light detection and photodiodes B1, B2, . . . , Bn-1 and Bn (a blue diode line 13) for blue light detection which are provided in a line, respectively. The green diode line 12 positioned between the red diode line 11 and the blue diode line 13 is provided with a shift of an approximately ½ pitch in the vertical direction of the photodiode as shown.

Electric charge transfer channels 21, 22 and 23 constituting an electric charge transfer section for transferring signal charges detected by the photodiodes R1 to Rn, G1 to Gn and B1 to Bn are formed close to the red diode line 11, the green diode line 12 and the blue diode line 13 respectively and take a winding shape extended in a main scanning direction. The signal charges read from the photodiodes R1 to Rn, G1 to Gn and B1 to Bn onto the electric charge transfer channels 21, 22 and 23 in a predetermined timing are transferred in the main scanning direction by the supply of a predetermined shift pulse to an electric charge transfer electrode which is not shown in FIG. 1, and are output from output ends OUT31, OUT32 and OUT33.

Figure 4:
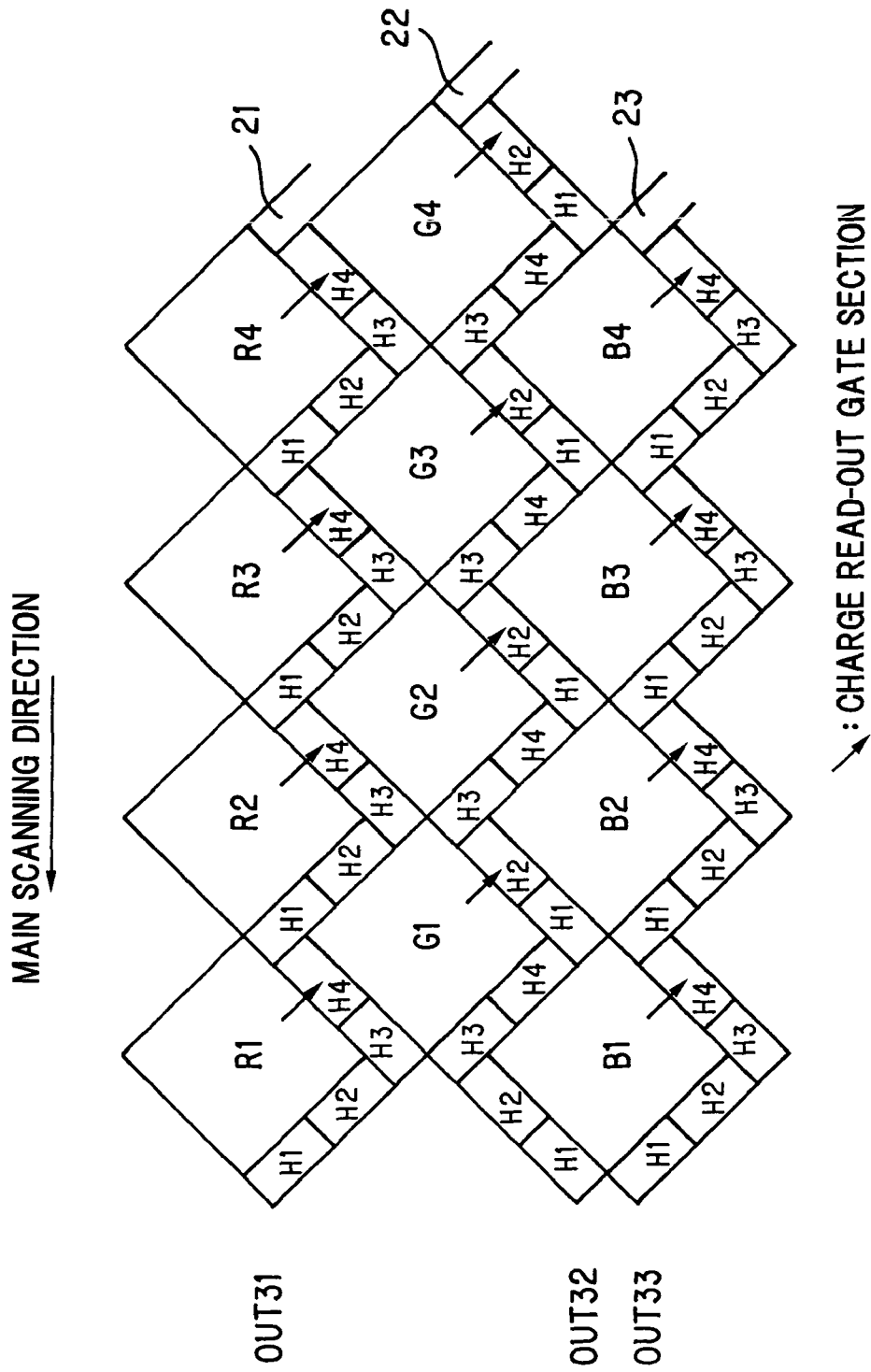
FIG. 4 is a view showing, in more detail, a part of the image pick-up section of the linear image sensor according to the first embodiment.

Before the explanation of a processing for image pick-up signals to be output from the output ends OUT31, OUT32 and OUT33, description will be given to the further detailed structure of the electric charge transfer section and the mechanism for reading a signal charge onto the electric charge transfer channel and transferring an electric charge to the output end. FIG. 4 shows the image pick-up section of the linear image sensor in FIG. 1 in more detail, and the electric charge transfer electrodes provided on the electric charge transfer channels 21, 22 and 23 are illustrated. Four electric charge transfer electrodes H1, H2, H3 and H4 are provided corresponding to one photodiode and are driven in a timing shifted by a ¼ cycle, respectively.

Figure 5:
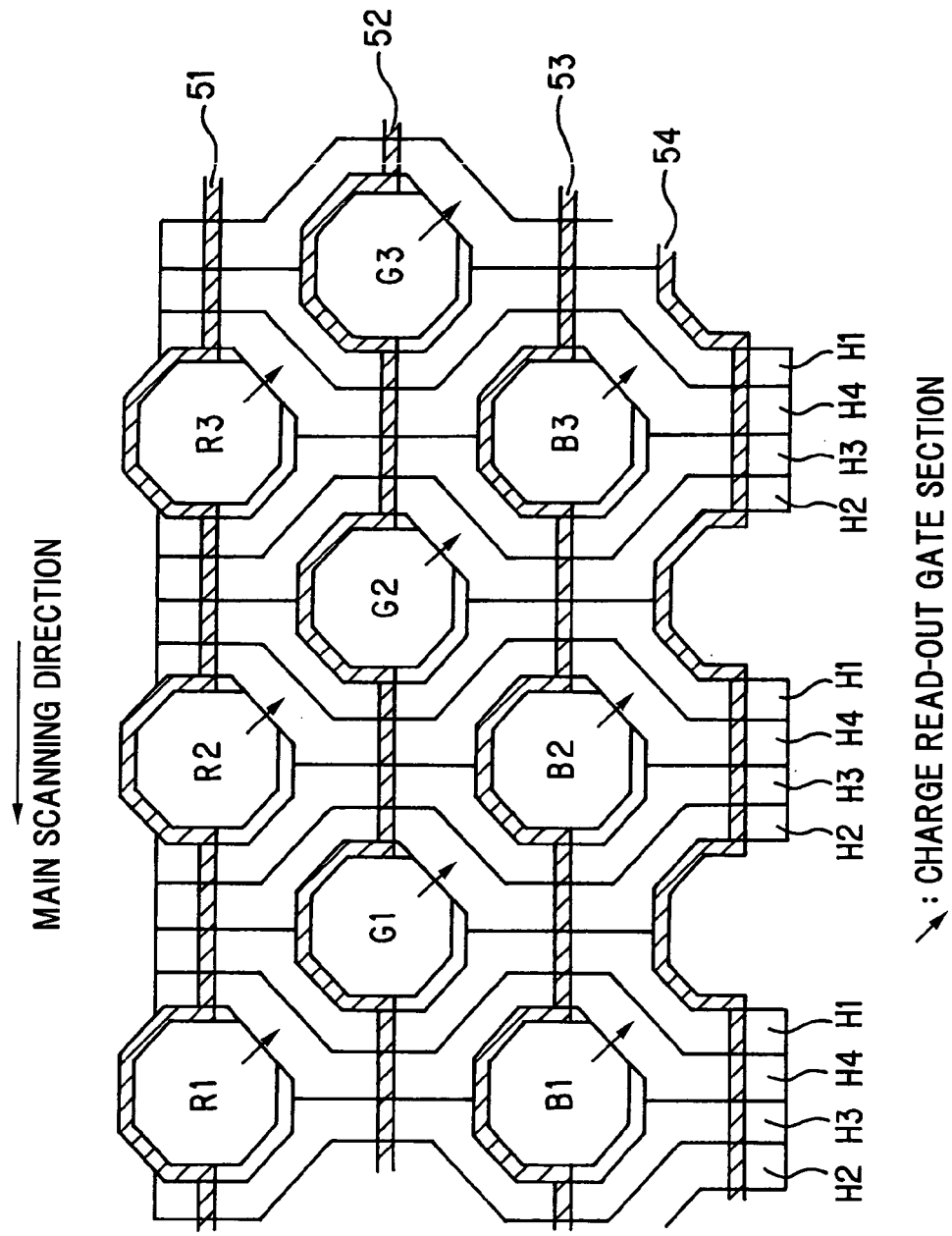
FIG. 5 is a view showing an example of the structure of an electric charge transfer electrode in the linear image sensor according to the first embodiment.

In FIG. 4, the electric charge transfer electrodes H1 to H4 are shown typically and singly corresponding to respective photodiodes for the electric charge transfer channels 21, 22 and 23 and they are specifically constituted by a common conductor as shown in FIG. 5. In FIG. 5, channel stop regions 51, 52, 53 and 54 for separating the diode lines 11, 12 and 13 having the colors are formed on a semiconductor substrate on which the photodiode is to be formed, and the electric charge transfer channel 21 is formed between the channel stop regions 51 and 52, the electric charge transfer channel 22 is formed between the channel stop regions 52 and 53, and the electric charge transfer channel 23 is formed between the channel stop regions 53 and 54. The electric charge transfer electrodes H1 to H4 are formed between the photodiodes to take a winding shape extended in such a direction as to cross a main scanning direction as a whole.

A reading gate section for reading a signal charge from the photodiode to the electric charge transfer channel is formed between the photodiode and the electric charge transfer channels 21 and 23 provided under the electric charge transfer electrode H4 in the red diode line 11 and the blue diode line 13, and is formed between the photodiode and the electric charge transfer channel 22 provided under the electric charge transfer electrode H2 in the green diode line 12. A reading gate electrode also serves as the electric charge transfer electrodes H4 and H2, and a reading pulse having a higher electric potential than that of a shift pulse is supplied to the electric charge transfer electrodes H4 and H2 so that the signal charges stored in the photodiodes are read onto the electric charge transfer channels 21, 22 and 23.

Figure 6:
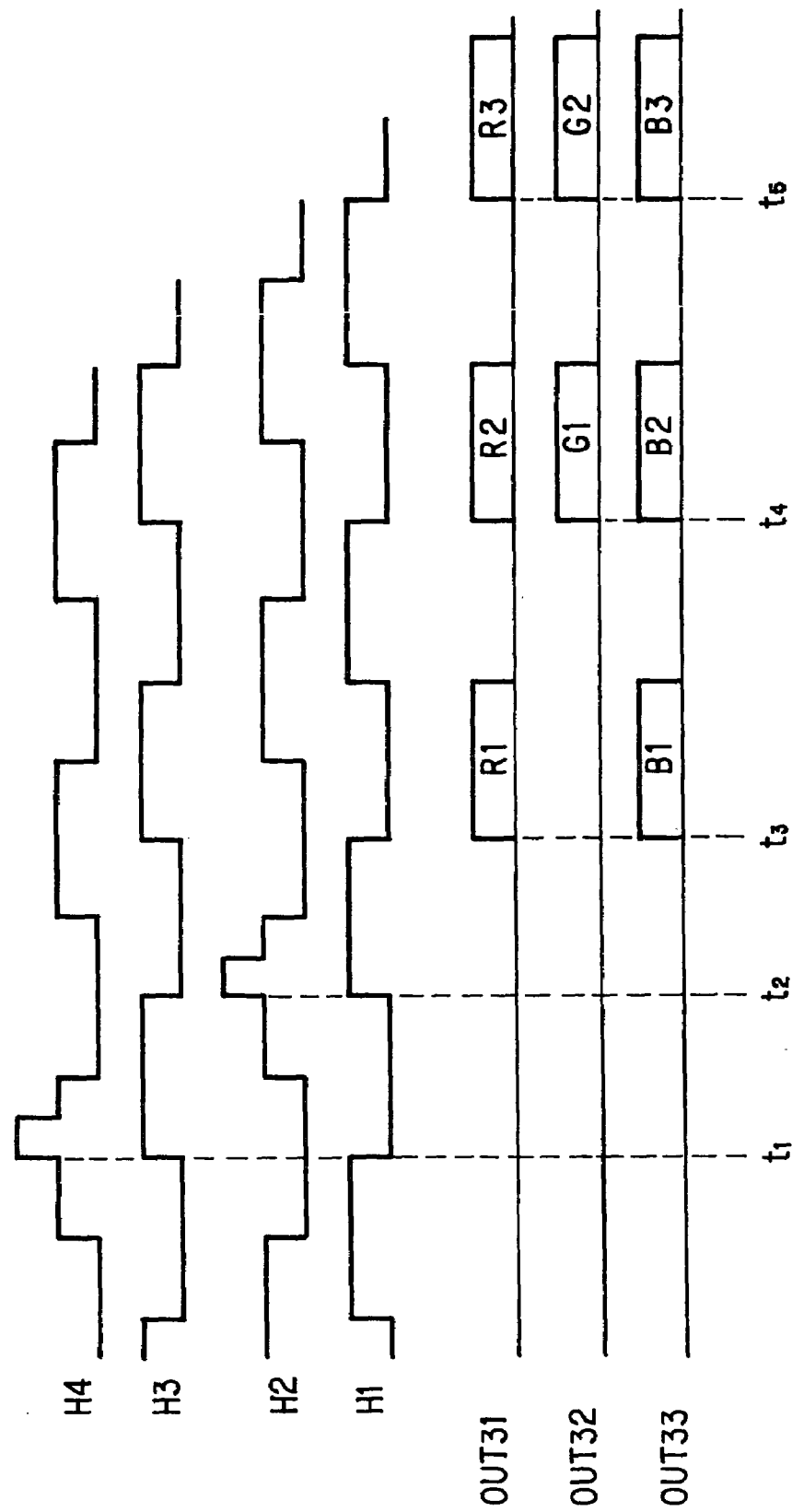
FIG. 6 is a time chart showing a reading operation and an electric charge transfer operation in the linear image sensor according to the first embodiment.

Next, an operation for reading a signal charge from a photodiode and an operation for transferring an electric charge will be described with reference to a time chart of FIG. 6. As shown in FIG. 6, 4-phase shift pulses shifted by a ¼ cycle are added to the electric charge transfer electrodes H1 to H4, and the signal charge held in the electric charge transfer channel provided under each electrode is sequentially transferred in the main scanning direction.

When a reading pulse is superposed on a shift pulse H4 at a time t1, the signal charges of the photodiodes R1 to Rn and B1 to Bn are read onto the electric charge transfer channels 21 and 23 through the reading gate, respectively. Moreover, when a reading pulse is superposed on a shift pulse H2 at a time t2, the signal charges of the photodiodes G1 to Gn are read onto the electric charge transfer channel 22 through the reading gate.

The signal charges read onto the electric charge transfer channels 21, 22 and 23 are sequentially transferred in accordance with a shift pulse and are sequentially output synchronously with the shift pulse from the output end OUT31, for example, the signal charge of the photodiode R1 is output at a time t3 and the signal charge of the photodiode R2 is output at a time t4. Similarly, the signal charge of the photodiode B1 is sequentially output from the output end OUT33 at the time t3. Moreover, the signal charge of the photodiode G1 is output at the time t4 and the signal charge of the photodiode G2 is output at a time t5 from the output end OUT32 to the output end OUT31 and the output end OUT33 sequentially with a delay of one cycle.

Accordingly, the signal charges output from the output ends OUT31 to OUT33 correspond to color signals in detection positions shown in FIG. 2. These signal charges are converted into voltage signals in an output section which is not shown and are output as color signals for the photodiodes.

In case of utilization as a color image signal, as is apparent from FIG. 2, a green (G) signal is shifted by an approximately ½ pitch. Therefore, a correction processing is carried out to make a red (R) signal, a green (G) signal and a blue (B) signal shown in FIG. 3. In FIG. 3(a), the correction is carried out on the basis of the position of the green diode line 12, and the R signal and the B signal have a mean value of the outputs of two adjacent diodes. In FIG. 3(b), moreover, the correction is carried out on the basis of the positions of the red diode line 11 and the blue diode line 13, and the G signal has a mean value of the outputs of two adjacent diodes. While the correction processing is carried out on the outside of the linear image sensor, it is not restricted to the above-mentioned method but other methods may be used.

As described above, in the linear image sensor according to the first embodiment, a plurality of adjacent diode lines are arranged with a shift of an approximately ½ pitch of a photodiode interval from each other and the electric charge transfer channel is provided to take a winding shape extended in the vertical direction of the photodiode line as a whole. Consequently, even if the photodiode line for detecting color signals of R, G and B is provided, a spacing between the lines is not increased.

Second Embodiment

Figure 7:
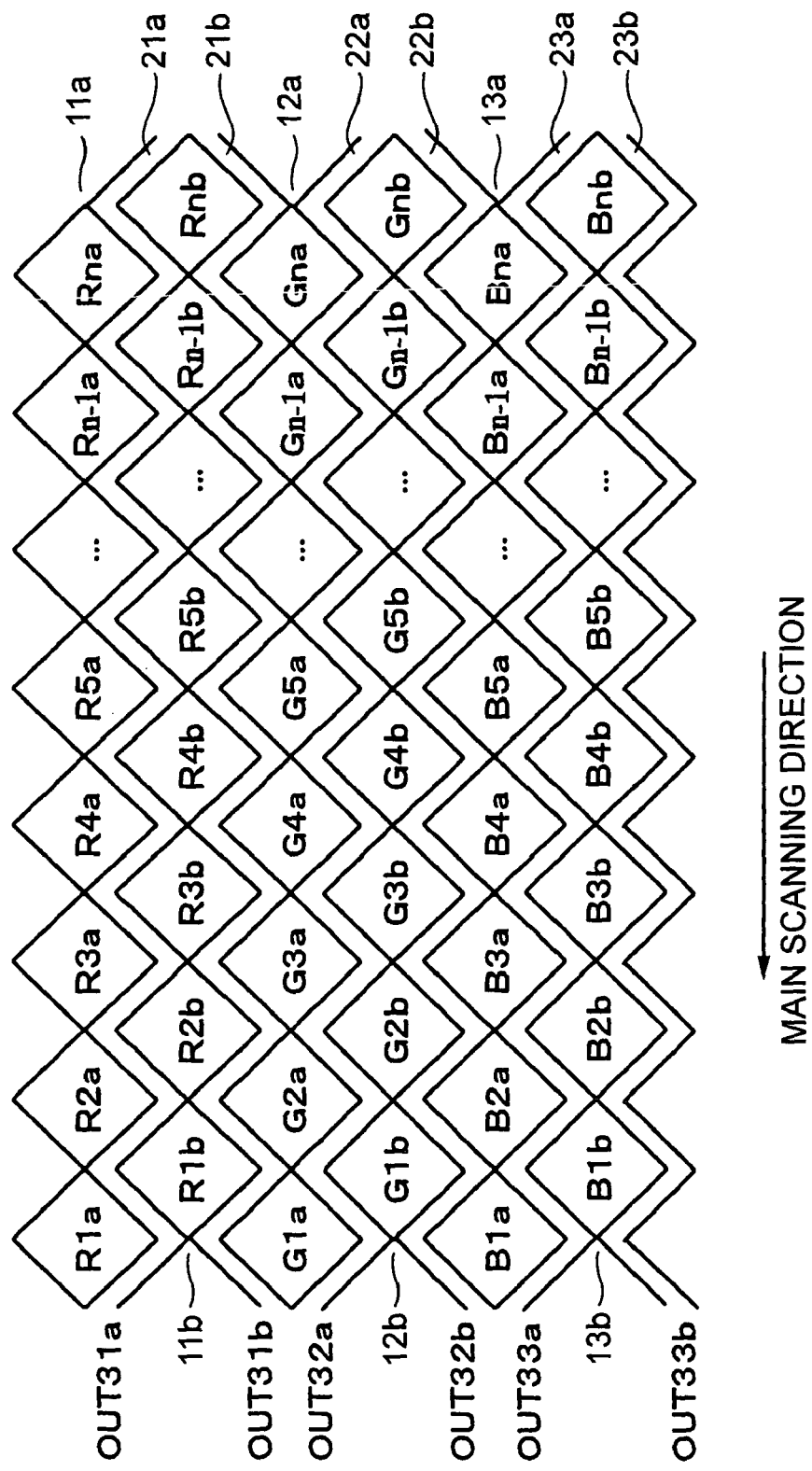
FIG. 7 is a view showing the schematic structure of a part of the image pick-up section of a linear image sensor according to a second embodiment.

FIG. 7 shows the schematic structure of a part of the image pick-up section of a linear image sensor according to a second embodiment. In the linear image sensor in FIG. 7, a photodiode for red light detection, a photodiode for green light detection and a photodiode for blue light detection are arranged in two lines, respectively.

A red diode line 11a in which photodiodes R1a, R2a, ..., Rn-1a and Rna for red light detection are arranged in a line and a red diode line 11b in which photodiodes R1b, R2b, ..., Rn-1b and Rnb for red light detection are arranged in a line are adjacently provided with a shift of an approximately ½ pitch in the vertical direction of the photodiode. Similarly, a green diode line 12a in which photodiodes G1a, G2a, ..., Gn-1a and Gna for green light detection are arranged in a line and a green diode line 12b in which photodiodes G1b, G2b, ..., Gn-1b and Gnb for green light detection are arranged in a line, and a blue diode line 13a in which photodiodes B1a, B2a, Bn-1a and Bna for blue light detection are arranged in a line and a blue diode line 13b in which photodiodes B1b, B2b, ..., Bn-1b and Bnb for blue light detection are arranged in a line are also provided adjacently with a shift of an approximately ½ pitch in the vertical direction of the photodiode. Moreover, the red diode line 11b and the green diode line 12a, and the green diode line 12b and the blue diode line 13a are also provided with a shift of an approximately ½ pitch in the vertical direction of the photodiode.

Electric charge transfer channels 21a, 21b, 22a, 22b, 23a and 23b constituting an electric charge transfer section for transferring signal charges detected by the photodiodes R1a to Rna, R1b to Rnb, G1a to Gna, G1b to Gnb, B1a to Bna and B1b to Bnb are formed close to the red diode lines 11a and 11b, the green diode lines 12a and 12b, and the blue diode lines 13a and 13b respectively and take a winding shape extended in the main scanning direction. The signal charges read from the photodiodes R1a to Rna, R1b to Rnb, G1a to Gna, G1b to Gnb, B1a to Bna, and B1b to Bnb onto the electric charge transfer channels 21a, 21b, 22a, 22b, 23a and 23b in a predetermined timing are transferred in the main scanning direction by the supply of a predetermined shift pulse to an electric charge transfer electrode which is not shown in FIG. 7 and are output from output ends OUT31a, OUT31b, OUT32a, OUT32b, OUT33a and OUT33b.

Electric charge transfer electrodes (not shown) provided on the electric charge transfer channels 21a, 21b, 22a, 22b, 23a and 23b are provided with four electric charge transfer electrodes H1, H2, H3 and H4 corresponding to one photodiode in the same manner as those in the linear image sensor according to the first embodiment shown in FIGS. 4 and 5, and are driven in a timing shifted by a ¼ cycle, respectively. Moreover, the electric charge transfer electrodes H1 to H4 are formed between the photodiodes to take a winding shape extended in such a direction as to cross the main scanning direction as a whole. Furthermore, a reading gate section for reading the signal charge from the photodiode to the electric charge transfer channel is also formed in the same position as that in the linear image sensor according to the first embodiment.

Figure 8:
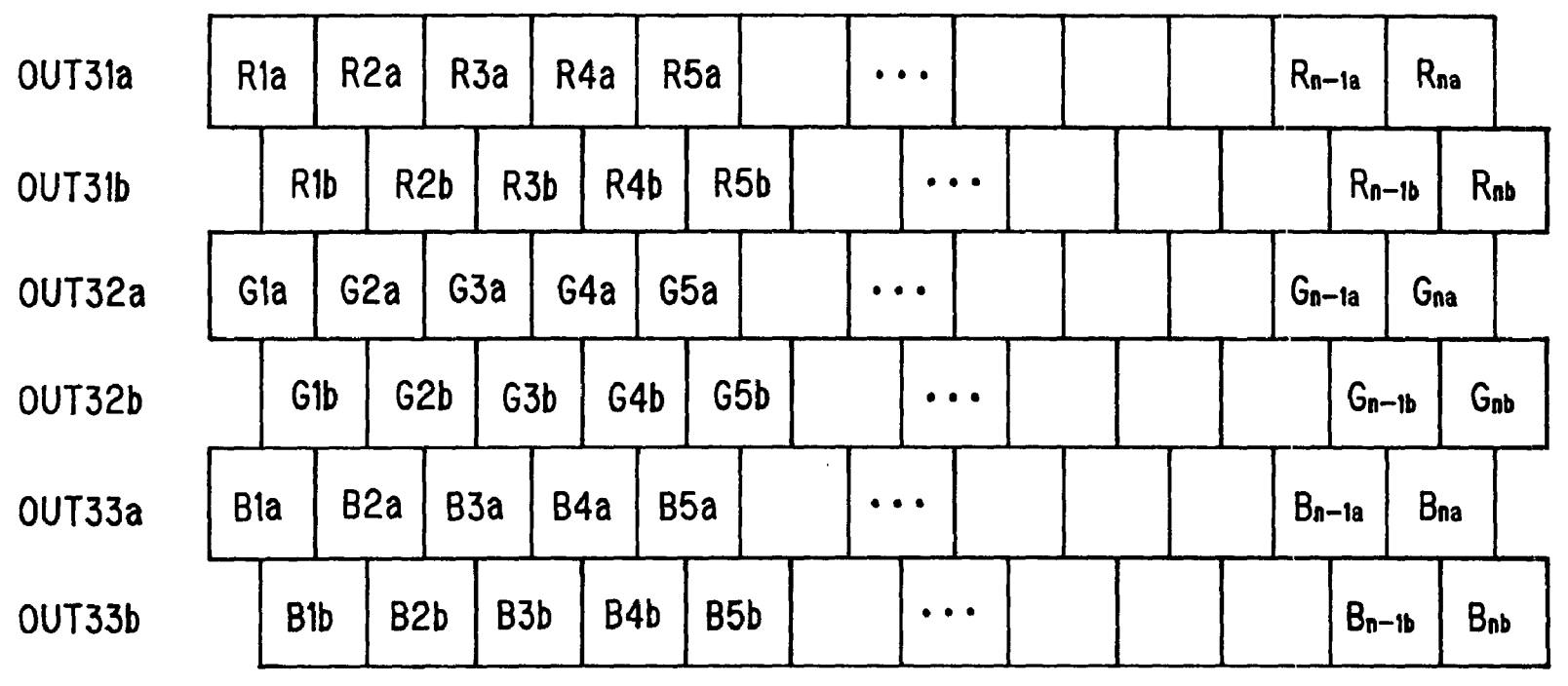

When the same shift pulse and reading pulse as those in the linear image sensor according to the first embodiment are added to the electric charge transfer electrodes H1 to H4, accordingly, the signal charges output from the output ends OUT31a to OUT33b correspond to the color signals in detection positions shown in FIG. 8. These signal charges are converted into voltage signals in an output section which is not shown and are output as color signals for the photodiodes.

As is apparent from FIG. 8, an R signal, a G signal and a B signal output from the output ends OUT31b, OUT32b and OUT33b are shifted by an approximately ½ pitch from an R signal, a G signal and a B signal output from the output ends OUT31a, OUT32a and OUT33a. Therefore, if (R1a, G1a, B1a), (R1b, G1b, B1b), (R2a, G2a, B2a), . . . are utilized as color image signals as shown in FIG. 9, therefore, a resolution in the main scanning direction can be increased to be a double of the layout pitch of the photodiode.

On the outside of the linear image sensor, moreover, the R signal sent from the output ends OUT31a and the OUT31b, the G signal sent from the output ends OUT32a and OUT32b and the B signal sent from the output ends OUT33a and OUT33b can be added to be utilized as the color image signals respectively as shown in FIG. 10. By such a utilization, the resolution in the main scanning direction is equal to the layout pitch of the photodiode and a sensitivity can be doubled.

While the electric charge transfer channels 21a and 21b provided close to the red diode lines 11a and 11b, the electric charge transfer channels 22a and 22b provided close to the green diode lines 12a and 12b, and the electric charge transfer channels 23a and 23b provided close to the blue diode lines 13a and 13b are connected to the separate output ends OUT31a, OUT31b, OUT32a, OUT32b, OUT33a and OUT33b respectively in the linear image sensor of FIG. 7, the electric charge transfer channels 21a and 21b, the electric charge transfer channels 22a and 22b and the electric charge transfer channels 23a and 23b may be connected respectively to make separate output ends. In that case, the number of shift stages from the red diode line 11b, the green diode line 12b and the blue diode line 13b is omitted corresponding to a ½ cycle on this side of the output end.

By such a structure, a color signal shown in FIG. 9 is output from each of the output ends. Consequently, it is possible to utilize the color signal as a color image signal having a resolution which is a double of the layout pitch of the photodiode.

Third Embodiment

Figure 11:
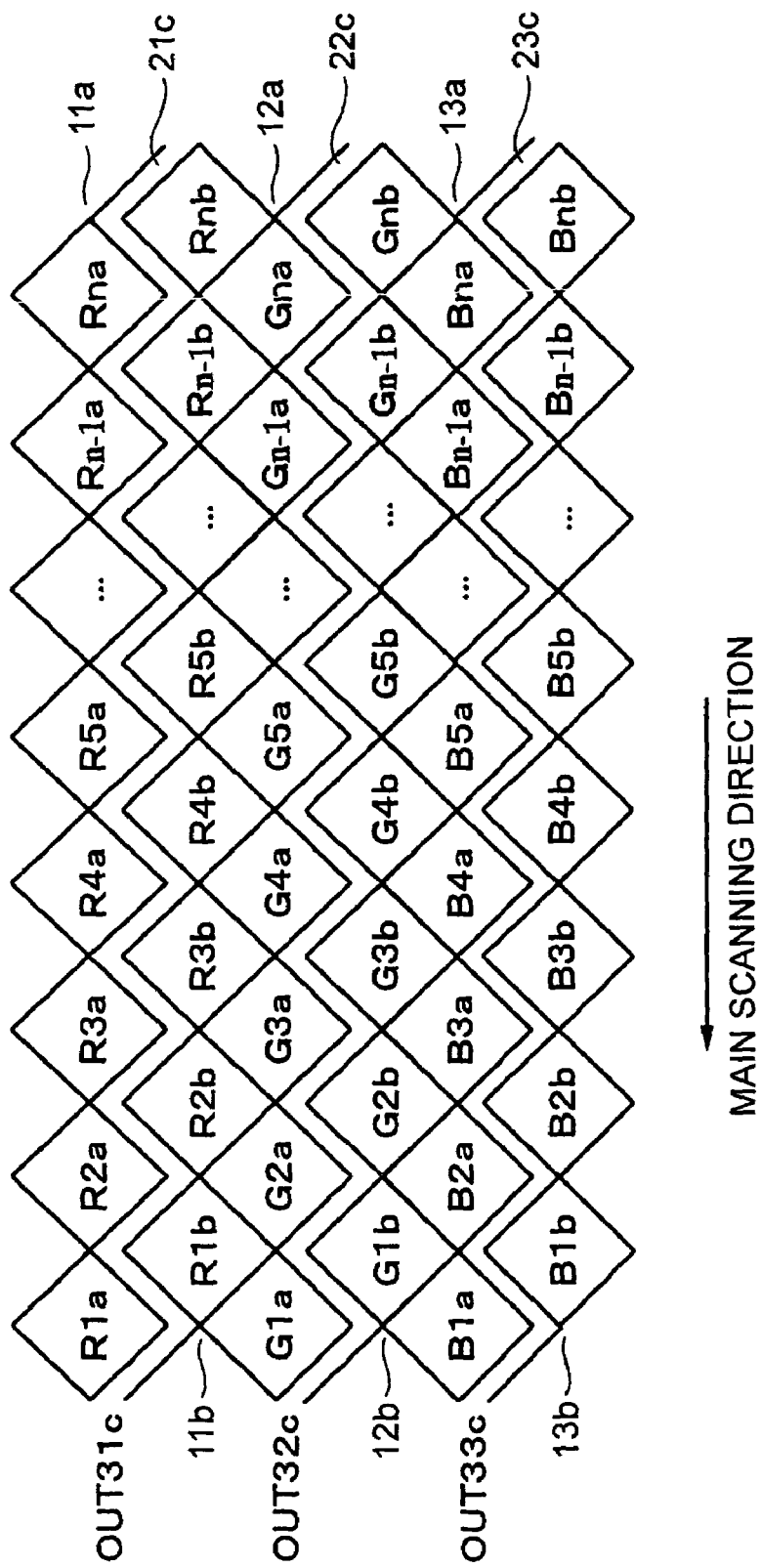
FIG. 11 is a view showing the schematic structure of a part of the image pick-up section of a linear image sensor according to a third embodiment.

FIG. 11 shows the schematic structure of a part of the image pick-up section of a linear image sensor according to a third embodiment. The linear image sensor in FIG. 11 is constituted to include two red diode lines 11a and 11b, two green diode lines 12a and 12b, and two blue diode lines 13a and 13b, and their positional relationship is the same as that of the second embodiment.

The structure of an electric charge transfer channel according to the third embodiment is different from that of the second embodiment. In the linear image sensor shown in FIG. 11, an electric charge transfer channel 21c for transferring the signal charges of the two red diode lines 11a and 11b, an electric charge transfer channel 22c for transferring the signal charges of the two green diode lines 12a and 12b, and an electric charge transfer channel 23c for transferring the signal charges of the two blue diode lines 13a and 13b are provided between the red diode lines 11a and 11b, between the green diode lines 12a and 12b and between the blue diode lines 13a and 13b, respectively.

Moreover, the position of an electric charge reading gate is also different. In the linear image sensor shown in FIG. 11, the electric charge reading gate is formed between the red diode line 11a, green diode line 12a and blue diode line 13a and the electric charge transfer channels 21c, 22c and 23c provided under the electric charge transfer electrode H4 and between the red diode line 11b, green diode line 12b and blue diode line 13b and the electric charge transfer channels 21c, 22c and 23c provided under the electric charge transfer electrode H1 as shown in arrows of FIG. 13.

As shown in FIG. 13, the electric charge transfer channel 21c is formed between channel stop regions 55 and 56 provided on a semiconductor substrate on which the photodiode is to be formed, the electric charge reading channels of the photodiodes R1a, R2a and R3a are formed between the same photodiodes and the electric charge transfer electrode H4, and the electric charge reading channels of the photodiodes R1b, R2b and R3b are formed between the same photodiodes and the electric charge transfer electrode H1. The electric charge transfer electrodes H1 to H4 are formed between the photodiodes to take a winding shape extended in such a direction as to cross a main scanning direction as a whole in the same manner as in the first embodiment (see FIG. 5).

Figure 14:
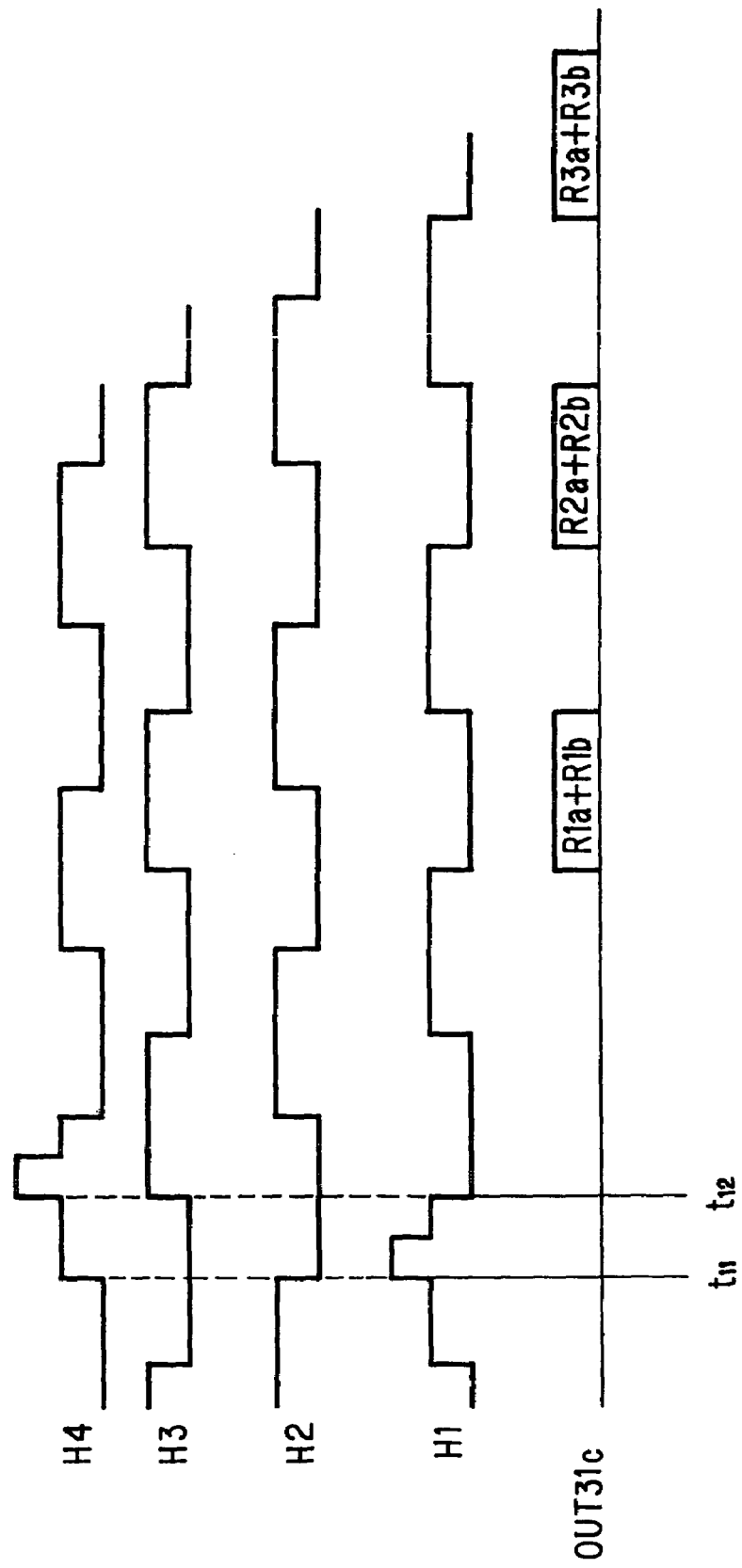
FIG. 14 is a time chart showing a reading operation and an electric charge transfer operation in the linear image sensor according to the third embodiment.

Since the electric charge reading channel is provided in positions corresponding to the electric charge transfer electrodes H4 and H1, a reading pulse having a higher electric potential than that of the shift pulse is superposed on the shift pulses H1 and H4 at times t11 and t12 respectively as shown in FIG. 14. By carrying out such driving, an electric charge obtained by adding the signal charge of the photodiode R1a to that of the photodiode R1b is output, and subsequently, an electric charge obtained by adding the signal charge of the photodiode R2a to that of the photodiode R2b is sequentially output from an output end OUT31c.

Accordingly, signal charges output from output ends OUT31c to OUT33c correspond to the color signals in the detection positions shown in FIG. 12. These signal charges are converted into voltage signals in an output section which is not shown and are output as color signals for the photodiodes. As is apparent from FIG. 12, the linear image sensor in FIG. 11 can output the same signal as the color image signal shown in FIG. 10 and can pick up an image with a high sensitivity also when scanning is to be carried out at a high speed in the main scanning direction to pick up an image. In addition, the addition of the signals is carried out by the signal charges. Therefore, it is possible to decrease the number of output sections and to considerably reduce a signal processing amount.

Fourth Embodiment

While the photodiodes for detecting a light having the same color are provided in a line in the embodiments described above, a linear image sensor according to a fourth embodiment is constituted to include photodiodes for detecting lights having different colors in the same line. FIG. 15 shows the schematic structure of a part of the image pick-up section of the linear image sensor according to the fourth embodiment. The linear image sensor shown in FIG. 15 is constituted to include a red/blue diode line 211 having photodiodes R1, R2, ..., Rn for red light detection and photodiodes B1, B2, ..., Bn for blue light detection arranged alternately in a line, and a green diode line 212 having photodiodes G1, G2, ..., G2n-1 and G2n for green light detection arranged in a line. The green diode line 212 is provided with a shift of an approximately ½ pitch in the vertical direction of the photodiode from the red/blue diode line 211 as shown.

An electric charge transfer channel 221 constituting an electric charge transfer section for transferring signal charges detected by the photodiodes R1 to Rn and B1 to Bn is formed close to the red/blue diode line 211, and an electric charge transfer channel 222 constituting an electric charge transfer section for transferring signal charges detected by the photodiodes G1 to G2n is formed close to the green diode line 212. The electric charge transfer channels 221 and 222 take a winding shape extended in the main scanning direction in the same manner as in the other embodiments.

The signal charges read from the photodiodes R1 to Rn, B1 to Bn and G1 to G2n onto the electric charge transfer channels 221 and 222 are transferred in the main scanning direction by the supply of a predetermined shift pulse to an electric charge transfer electrode which is not shown in FIG. 15, and are output from output ends OUT231 and OUT232.

Electric charge transfer electrodes (not shown) provided on the electric charge transfer channels 221 and 222 are provided with four electric charge transfer electrodes H1, H2, H3 and H4 corresponding to one photodiode in the same manner as those in the linear image sensor according to the first embodiment shown in FIGS. 4 and 5, and are driven in a timing shifted by a ¼ cycle, respectively. Moreover, the electric charge transfer electrodes H1 to H4 are formed between the photodiodes to take a winding shape extended in such a direction as to cross the main scanning direction as a whole. Furthermore, a reading gate section for reading the signal charge from the photodiode to the electric charge transfer channel is also formed in the same position as that in the linear image sensor according to the first embodiment.

When the same shift pulse and reading pulse as those in the linear image sensor according to the first embodiment are added to the electric charge transfer electrodes H1 to H4, accordingly, the signal charges output from the output ends OUT231 and OUT232 correspond to the color signals in detection positions shown in FIG. 16. These signal charges are converted into voltage signals in an output section which is not shown and are output as color signals for the photodiodes.

In case of utilization as a color image signal, signals having three colors of R, G and B are required. Therefore, a color signal in a portion which is not detected is obtained by an interpolation as shown in FIG. 17. As is apparent from FIG. 17, moreover, the G signal is shifted by an approximately ½ pitch from the R signal and the B signal. Therefore, the correction processing is further carried out to make the RGB signal shown in FIG. 3. Such an image signal processing is carried out on the outside of the linear image sensor. In addition, a processing method is not restricted to this method.

Fifth Embodiment

FIG. 18 shows the schematic structure of a part of the image pick-up section of a linear image sensor according to a fifth embodiment. The linear image sensor in FIG. 18 is constituted to include photodiodes R1, R2, ..., Rn-1 and Rn (a red diode line 11) for detecting a red light, photodiodes G1, G2, ..., Gn-1 and Gn (a green diode line 12) for detecting a green light and photodiodes B1, B2, ..., Bn-1 and Bn (a blue diode line 13) for detecting a blue light which are provided in a line, respectively. The green diode line 12 positioned between the red diode line 11 and the blue diode line 13 is provided with a shift of an approximately ½ pitch in the vertical direction of the photodiode as shown.

Electric charge transfer channels (hereinafter referred to as "vertical transfer channels" in some cases) 21a to 2na and 21b to 2nb constituting a first electric charge transfer section (hereinafter referred to as a "vertical transfer section" in some cases) for transferring signal charges detected by the photodiodes R1 to Rn, G1 to Gn and B1 to Bn serve to carry out a transfer in such a direction as to cross the vertical direction of the photodiode. The electric charge transfer channels 21a to 2na are formed close to the photodiodes R1 and B1, R2 and B2, ..., and Rn and Bn respectively, and the electric charge transfer channels 21b to 2nb are formed close to the photodiodes G1 to Gn respectively and take a winding shape extended in such a direction (hereinafter referred to as a "vertical direction" in some cases) as to cross a main scanning direction (hereinafter referred to as a "horizontal direction" in some cases). Signal charges read in a predetermined timing from the corresponding diodes are transferred to the electric charge transfer channel (hereinafter referred to as a "horizontal transfer channel" in some cases) 30 through a vertical and horizontal transfer region 40. Signal charges read onto the vertical transfer channels 21a to 2na and 21b to 2nb are transferred in the vertical direction by the supply of a predetermined shift pulse to a first electric charge transfer electrode (hereinafter referred to as a "vertical transfer electrode" in some cases) which is not shown in FIG. 18.

The second electric charge transfer channel 30 constitutes a second electric charge transfer section together with a second electric charge transfer electrode (hereinafter referred to as a "horizontal transfer electrode" in some cases) which is not shown in FIG. 1, and supplies a predetermined shift pulse to the second electric charge transfer electrode, thereby transferring the signal charges detected by the photodiodes R1 to Rn, G1 to Gn and B1 to Bn in the main scanning direction. Then, the signal charges are output from an output end OUT.

The vertical and horizontal transfer region 40 is provided for transferring the signal charges from the vertical transfer channels 21a to 2na and 21b to 2nb to the horizontal transfer channel 30, and is controlled by giving a predetermined shift pulse to a transfer electrode which is not shown. The shift pulse has a predetermined relationship with the shift pulse supplied to the vertical transfer electrode and the horizontal transfer electrode, and the signal charges sent from the photodiodes R1 to Rn, G1 to Gn and B1 to Bn are transferred to the predetermined region of the horizontal transfer channel 30, respectively.

The signal charges sent from the photodiodes R1 to Rn, G1 to Gn and B1 to Bn are read onto the horizontal transfer channel 30 with a relative positional relationship shown in FIG. 18. Accordingly, the signal charges are output from the output end OUT in order of B1, R1, G1, B2, R2, G2, B3, ..., Bn, Rn and Gn. Each of these signal charges is converted into a voltage signal in an output section which is not shown, and is output as a color signal for each photodiode. The transfer position of the signal charge in the horizontal transfer channel in FIG. 18 is typically shown and there may be a partial region two which the signal charge is not transferred.

The color signal for each photodiode to be output corresponds to each color signal of a detection position shown in FIG. 19 and a green (G) signal is shifted by an approximately ½ pitch. Therefore, in the case in which the color signal is to be utilized as a color image signal, a correction processing is carried out to make a red (R) signal, a green (G) signal and a blue (B) signal shown in FIG. 3. In FIG. 3(a), the correction is carried out on the basis of the position of the green diode line 12, and the R signal and the B signal have a mean value of the outputs of two adjacent diodes. In FIG. 3(b), moreover, the correction is carried out on the basis of the positions of the red diode line 11 and the blue diode line 13, and the G signal has a mean value of the outputs of two adjacent diodes. While the correction processing is carried out on the outside of the linear image sensor, it is not restricted to the above-mentioned method but other methods may be used.

Figure 20:
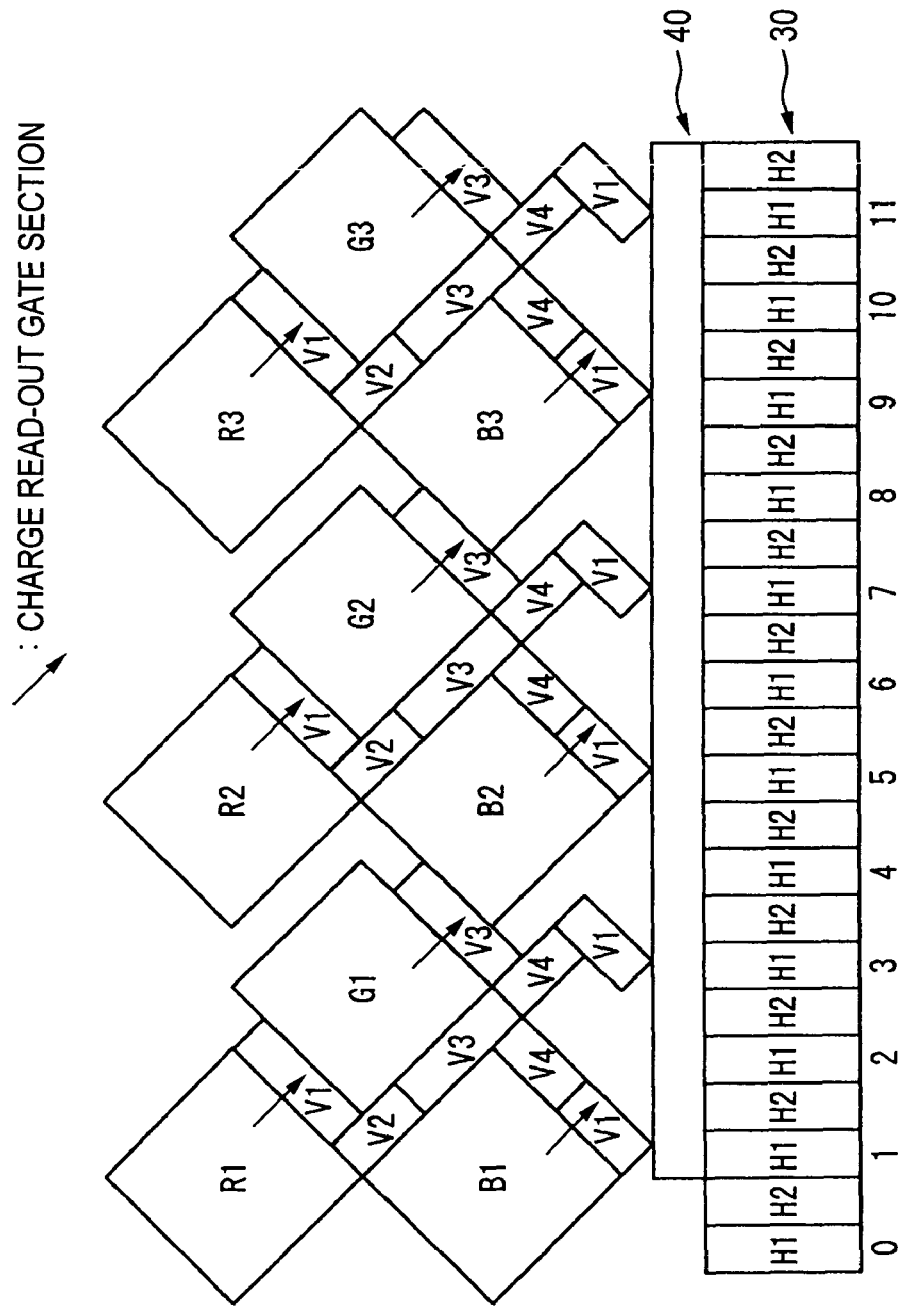
FIG. 20 is a view showing, in more detail, a part of the image pick-up section of the linear image sensor according to the fifth embodiment.

Next, description will be given to the further detailed structure of the first and second electric charge transfer sections and a mechanism for reading a signal charge onto the electric charge transfer channel and transferring an electric charge to the output end. FIG. 20 shows the image pick-up section of the linear image sensor in FIG. 18 in more detail, and the vertical transfer electrodes provided on the vertical transfer channels 21a to 2na and 21b to 2nb and the horizontal transfer electrodes provided on the horizontal transfer channels are illustrated. Four electric charge transfer electrodes V1, V2, V3 and V4 are provided corresponding to one photodiode and are driven in a timing shifted by a ¼ cycle, respectively. Some of the electric charge transfer electrodes V1, V2, V3 and V4 are substantially unnecessary depending on the number of photodiode lines and a part thereof is omitted in FIG. 20.

Figure 21:
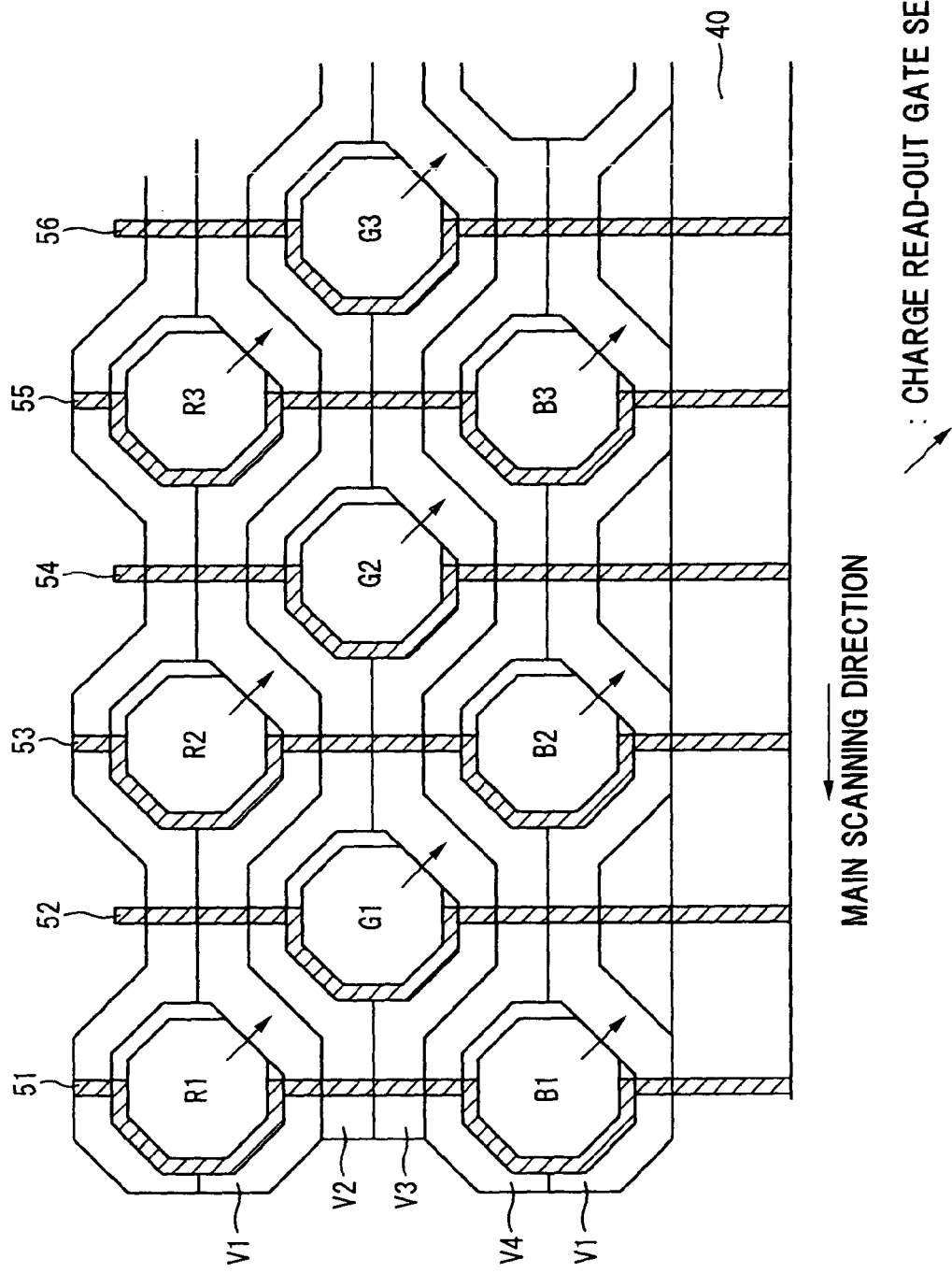
FIG. 21 is a view showing an example of the structure of an electric charge transfer electrode in the linear image sensor according to the fifth embodiment.

In FIG. 20, the vertical transfer electrodes V1 to V4 are shown typically and singly corresponding to respective photodiodes for the vertical transfer channels 21a to 2na and 21b to 2nb and they are specifically constituted by a common conductor as shown in FIG. 21. In FIG. 21, channel stop regions 51, 52, 53, 54, 55 and 56 for separating the photodiodes R1 to Rn, G1 to Gn and B1 to Bn having the colors are formed on a semiconductor substrate on which the photodiodes are to be formed, and the vertical transfer channel 21a is formed between the channel stop regions 51 and 52, the electric charge transfer channel 21b is formed between the channel stop regions 52 and 53, the electric charge transfer channel 22a is formed between the channel stop regions 53 and 54, the vertical transfer channel 22b is formed between the channel stop regions 54 and 55, and an electric charge transfer channel 23a is formed between the channel stop regions 55 and 56. The vertical transfer electrodes V1 to V4 are formed between the photodiodes to take a winding shape extended in a main scanning direction as a whole.

A reading gate section for reading a signal charge from the photodiode to the vertical transfer channel is formed between the vertical transfer channels 21*a* and 2*na* provided under the vertical transfer electrode V1 in the red diodes R1 to Rn and the blue diodes B1 to Bn and is formed between the vertical transfer channels 21*b* and 2*nb* provided under the vertical transfer electrode V3 in the green diodes G1 to Gn as typically shown in arrows of FIGS. 4 and 5. A reading gate electrode also serves as the vertical transfer electrodes V1 and V3, and a reading pulse having a higher electric potential than that of a shift pulse is supplied to the vertical transfer electrodes V1 and V3 so that the signal charges stored in the photodiodes are read onto the vertical transfer channels 21*a* to 2*na* and 21*b* to 2*nb*.

Two kinds of horizontal transfer electrodes H1 and H2 to be driven in a timing shifted by a half cycle are alternately provided on the horizontal transfer channel 30 and the signal charges are sequentially transferred and held. As schematically shown in FIG. 20, two horizontal transfer electrodes H1 and H2 are formed between the vertical transfer channels, respectively. Accordingly, two signal charges are transferred and held between the vertical transfer channels. In FIG. 20, a region holding a signal charge is indicated as a numeral of 0 to 11 for convenience.

A transfer electrode is provided on the vertical and horizontal transfer region 40 to transfer signal charges from the vertical transfer channels 21*a* to 2*na* and 21*b* to 2*nb* to the holding regions of the horizontal transfer channel 30 which are indicated as odd numerals, which is not shown.

Figures 22, 23:
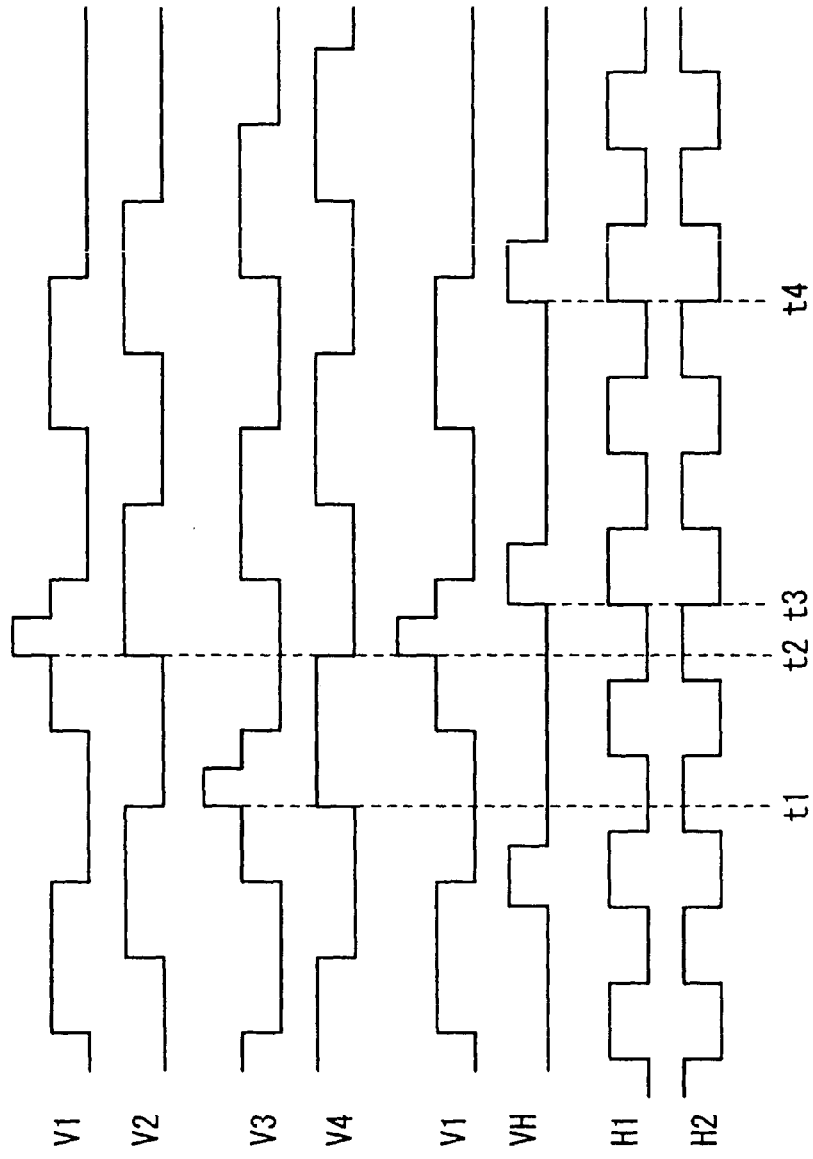
FIG. 22 is a time chart showing a reading operation and an electric charge transfer operation in the linear image sensor according to the fifth embodiment.

Next, an operation for reading a signal charge from a photodiode and an operation for transferring an electric charge will be described with reference to a time chart of FIG. 22. As shown in FIG. 22, 4-phase shift pulses shifted by a ¼ cycle are added to the vertical transfer electrodes V1 to V4 and two-phase shift pulses shifted by a half cycle are added to the horizontal transfer electrodes H1 and H2. Moreover, a pulse represented by VH is a shift pulse to be supplied to the transfer electrode provided on the vertical and horizontal transfer region 40.

When a reading pulse is superposed on a shift pulse V3 at a time t1, the signal charges of the photodiodes G1 to Gn are read onto the vertical transfer channels 21*b* to 2*nb* through a reading gate. Moreover, when a reading pulse is superposed on a shift pulse V1 at a time t2, the signal charges of the photodiodes R1 to Rn and B1 to Bn are read onto the vertical transfer channels 21*a* to 2*na* through the reading gate.

The signal charges read onto the vertical transfer channels 21*a* to 2*na* and 21*b* to 2*nb* are sequentially transferred and are transferred to the horizontal transfer channel 30 at a time t3. In each region of the horizontal transfer channel 30 at the time t3, accordingly, a signal charge shown in FIG. 23(*a*) is held. When the shift pulse VH is set to have a high level again at a time t4, the signal charge is transferred to the horizontal transfer channel 30 again. At this time, the signal charge transferred at the time t3 is transferred in a horizontal direction by the shift pulses H1 and H2. Therefore, a signal charge shown in FIG. 23(*b*) is held in each region of the horizontal transfer channel 30 at the time t4.

Then, when the shift pulses H1 and H2 are supplied, a signal charge is output from the output end OUT in order shown in FIG. 18. "-" in FIG. 23(*b*) indicates a portion having no signal charge, and it is preferable that a signal in this portion should be disregarded during a signal processing.

As described above, in the linear image sensor according to the fifth embodiment, a plurality of adjacent diode lines are arranged with a shift of an approximately ½ pitch of a photodiode interval from each other and the vertical transfer channel is provided to take a winding shape extended in such a direction as to cross the vertical direction of the photodiode as a whole. Consequently, even if the photodiode lines for detecting the color signals of R, G and B are provided, a spacing between the lines is not increased.

Sixth Embodiment

Figure 24:
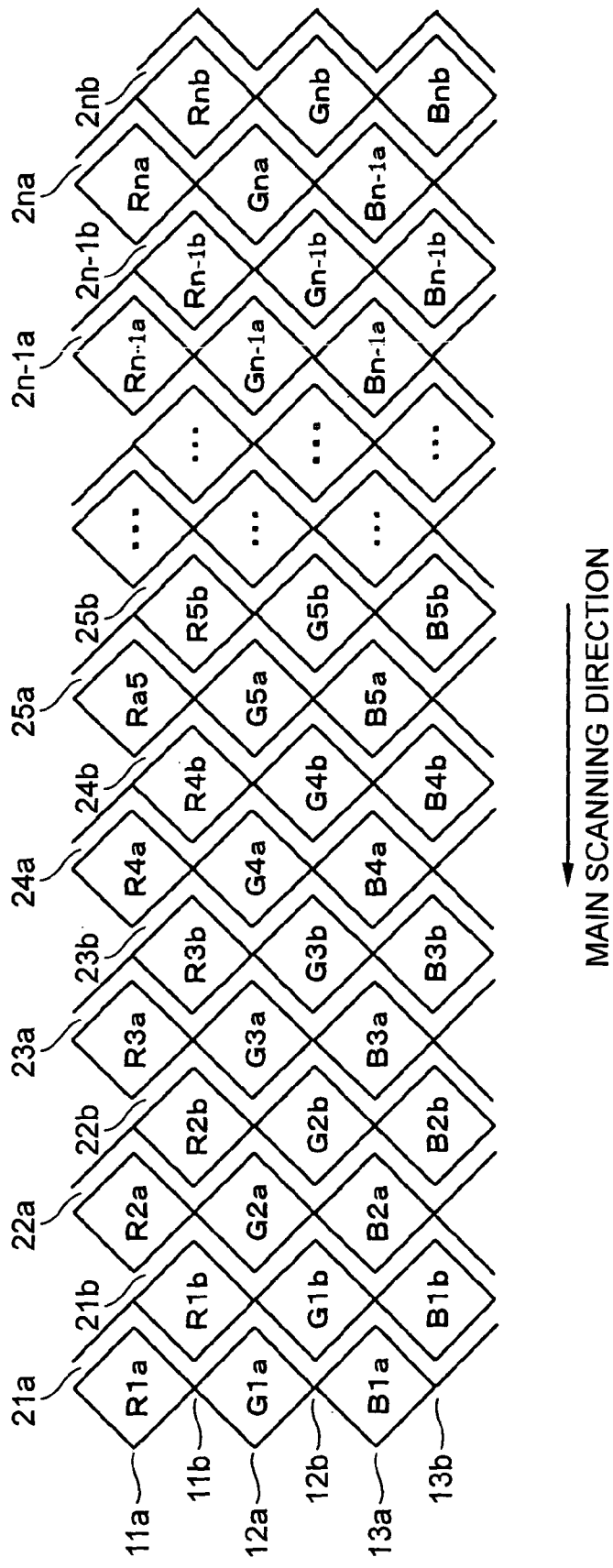
FIG. 24 is a view showing the schematic structure of a part of the image pick-up section of a linear image sensor according to a sixth embodiment.

FIG. 24 shows the schematic structure of a part of the image pick-up section of a linear image sensor according to a sixth embodiment. In the linear image sensor in FIG. 24, a photodiode for red light detection, a photodiode for green light detection and a photodiode for blue light detection are arranged in two lines, respectively. In FIG. 24, a vertical and horizontal transfer region and a horizontal transfer channel are not shown.

A red diode line 11*a* in which photodiodes R1*a*, R2*a*, . . . , Rn-1*a* and Rna for red light detection are arranged in a line and a red diode line 11*b* in which photodiodes R1*b*, R2*b*, . . . , Rn-1*b* and Rnb for red light detection are arranged in a line are adjacently provided with a shift of an approximately ½ pitch in the vertical direction of the photodiode. Similarly, a green diode line 12*a* in which photodiodes G1*a*, G2*a*, . . . , Gn-1*a* and Gna for green light detection are arranged in a line and a green diode line 12*b* in which photodiodes G1*b*, G2*b*, . . . , Gn-1*b* and Gnb for green light detection are arranged in a line, and a blue diode line 13*a* in which photodiodes B1*a*, B2*a*, . . . Bn-1*a* and Bna for blue light detection are arranged in a line and a blue diode line 13*b* in which photodiodes B1*b*, B2*b*, . . . , Bn-1*b* and Bnb for blue light detection are arranged in a line are also provided adjacently with a shift of an approximately ½ pitch in the vertical direction of the photodiode. Moreover, the red diode line 11*b* and the green diode line 12*a*, and the green diode line 12*b* and the blue diode line 13*a* are also provided with a shift of an approximately ½ pitch in the vertical direction of the photodiode.

Vertical transfer channels 21*a* to 2*na* and 21*b* to 2*nb* constituting a vertical transfer section for transferring signal charges detected by photodiodes R1*a* to Rna, R1*b* to Rnb, G1*a* to Gna, G1*b* to Gnb, B1*a* to Bna and B1*b* to Bnb serve to carry out a transfer in such a direction as to cross the vertical direction of the photodiode. The electric charge transfer channels 21*a* to 2*na* are formed close to the photodiodes R1*a*, G1*a* and B1*a*, R2*a*, G2*a* and B2*a*, . . . , and Rna, Gna and Bna respectively, and the electric charge transfer channels 21*b* to 2*nb* are formed close to the photodiodes R1*b*, G1*b* and B1*b*, R2*b*, G2*b* and B2*b*, . . . , and Rnb, Gnb and Bnb and take a winding shape extended in a vertical direction.

The signal charges read from the corresponding photodiodes in a predetermined timing respectively are transferred to the horizontal transfer channel through a vertical and horizontal transfer region which is not shown in FIG. 24, and are transferred and output in a horizontal direction. In this example, the signal charges are read from the vertical transfer channel to the horizontal transfer channel with a relative positional relationship shown in FIG. 25. It is possible to read the signal charges with the relative positional relationship by changing the layout density of the horizontal transfer electrode. Moreover, it is also necessary to change the number of shift pulses to be supplied to the vertical transfer electrode and the transfer electrode provided on the vertical and horizontal transfer region.

Figures 25, 26:
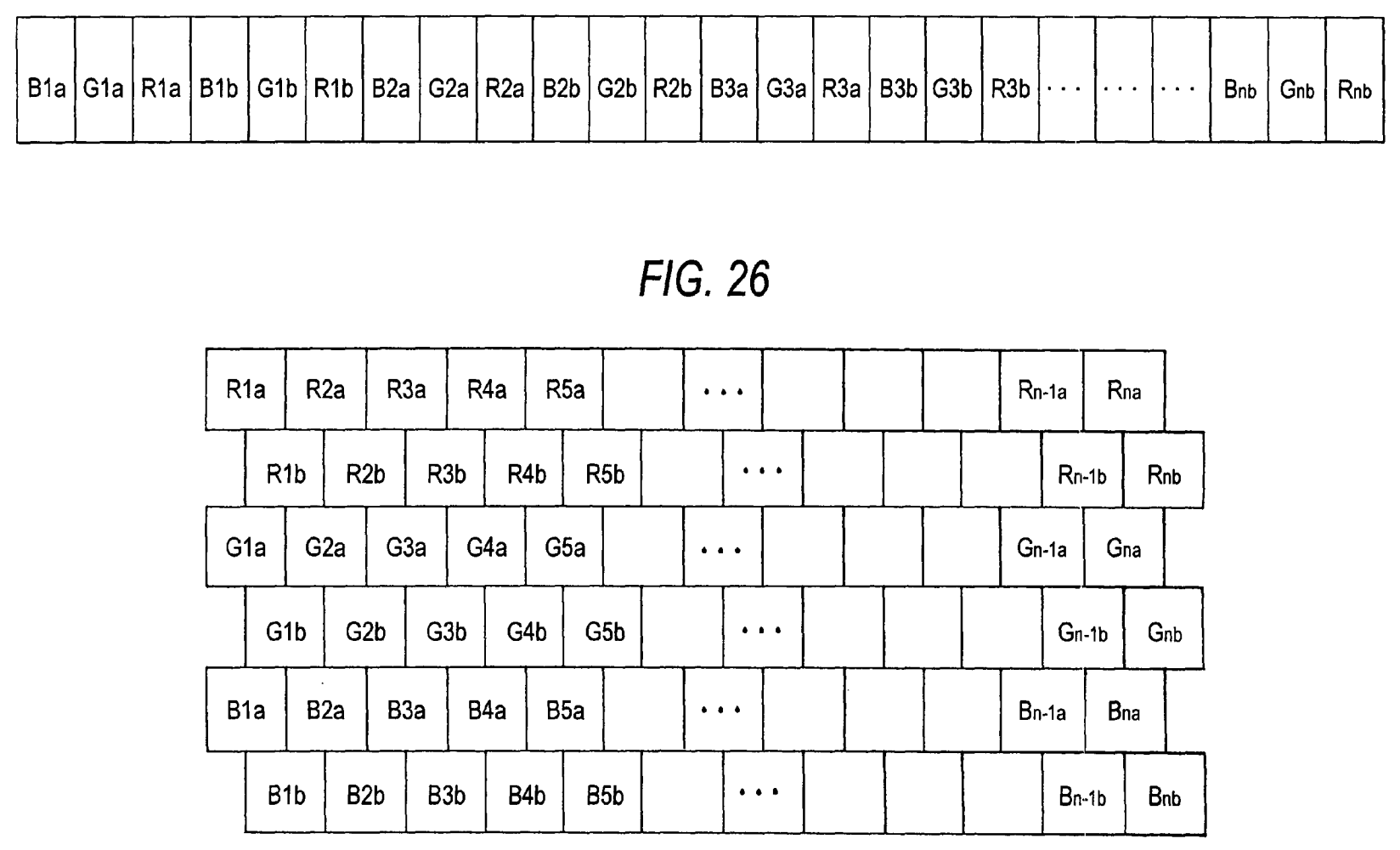

A color signal for each photodiode to be output corresponds to each color signal in a detection position shown in FIG. 26. As is apparent from FIG. 26, the red signals R1a to Rna, the green signals G1a to Gna and the blue signals B1a to Bna are shifted by an approximately ½ pitch from the red signals R1b to Rnb, the green signals G1b to Gnb and the blue signals B1b to Bnb, respectively. As shown in FIG. 9, therefore, it is possible to increase a resolution in a main scanning direction to be a double of the layout pitch of the photodiode by utilizing, as color image signals, (R1a, G1a, B1a), (R1b, G1b, B1b), (R2a, G2a, B2a), .... Moreover, it is also possible to utilize them by carrying out an addition shown in FIG. 10. In this case, the resolution in the main scanning direction is equal to the layout pitch of the photodiode and a sensitivity can be doubled.

Seventh Embodiment

Figure 27:
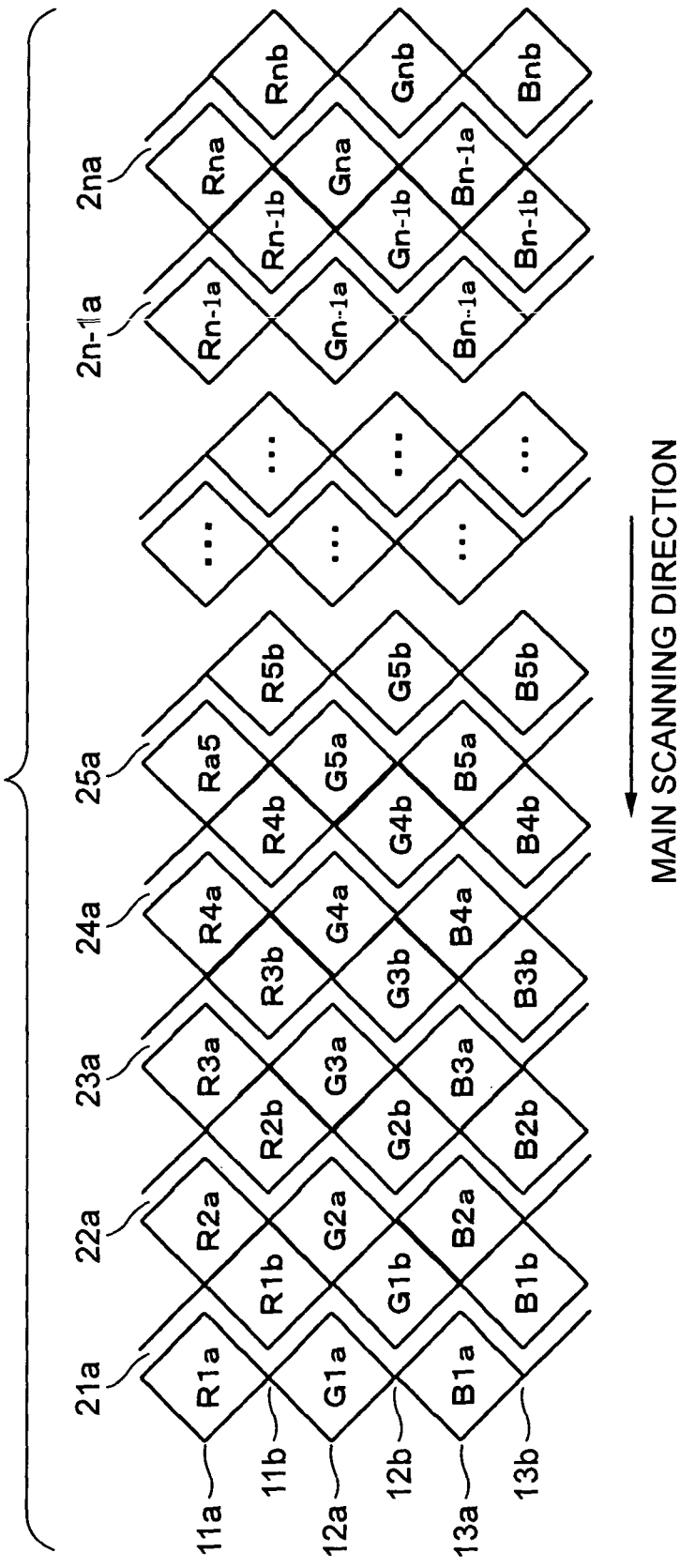
FIG. 27 is a view showing the schematic structure of a part of the image pick-up section of a linear image sensor according to a seventh embodiment.

FIG. 27 shows the schematic structure of a part of the image pick-up section of a linear image sensor according to a seventh embodiment. The linear image sensor in FIG. 27 is constituted to include two red diode lines 11a and 11b, two green diode lines 12a and 12b, and two blue diode lines 13a and 13b, and their positional relationship is the same as that of the sixth embodiment. Also in FIG. 27, a vertical and horizontal transfer region and a horizontal transfer channel are not shown.

Figure 28:
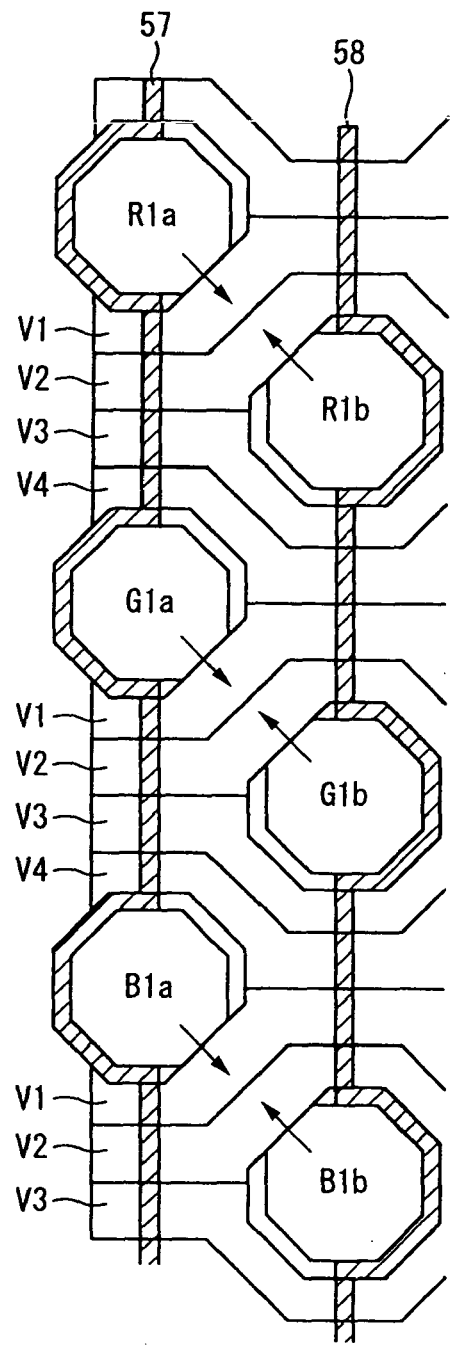
FIG. 28 is a view showing, in detail, a part of the image pick-up section of the linear image sensor according to the seventh embodiment.

The structure of a vertical transfer channel is different from that of the second embodiment. In the linear image sensor shown in FIG. 27, vertical transfer channels 21b to 2nb are omitted and the position of an electric charge reading gate is changed. In the linear image sensor of FIG. 27, as shown in an arrow of FIG. 28, the red diode line 11a, the green diode line 12a and the blue diode line 13a are formed between vertical transfer channels 21a and 2na provided under a vertical transfer electrode V1, and the red diode line 11b, the green diode line 12b and the blue diode line 13b are formed between vertical transfer channels 21a and 2na provided under a vertical transfer electrode V2.

The vertical transfer channel 21a is formed between channel stop regions 57 and 58 formed on a semiconductor substrate on which a photodiode is to be formed, a channel for reading the electric charges of photodiodes R1a, G1a and B1a is provided between the same photodiodes and the electric charge transfer electrode V1 and a channel for reading the electric charges of photodiodes R1b, G1b and B1b is provided between the same photodiodes and the electric charge transfer electrode V2.

Since the electric charge reading channel is provided in positions corresponding to the electric charge transfer electrodes V1 and V2, a reading pulse having a higher electric potential than that of a shift pulse is superposed on the shift pulses V1 and V2. By carrying out such driving, the signal charges of the photodiodes R1a and R1b, G1a and G1b and B1a and B1b are added in the vertical transfer channel 21a and are then transferred.

Figures 29, 30:
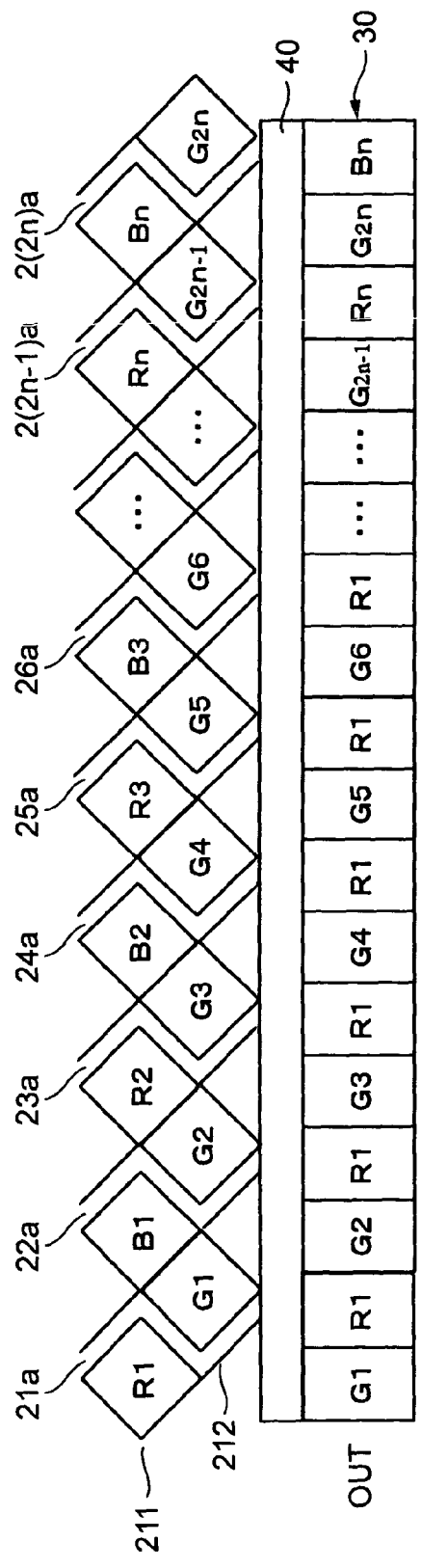
FIG. 29 is a view showing a relative position in a horizontal transfer channel for a signal charge in the linear image sensor according to the seventh embodiment.
FIG. 30 is a view showing the schematic structure of a part of the image pick-up section of a linear image sensor according to an eighth embodiment.

Accordingly, reading is carried out from the vertical transfer channel to the horizontal transfer channel with a relative positional relationship shown in FIG. 29 and a color signal for each photodiode to be output can be utilized as a color image signal having a high sensitivity shown in FIG. 10. Moreover, the addition of the signals is carried out by the signal charge. Consequently, the number of stages of a horizontal transfer section can be decreased and a signal processing amount can also be reduced.

Eighth Embodiment

While the photodiodes for detecting a light having the same color are provided in a line in the embodiments described above, a linear image sensor according to an eighth embodiment is constituted to include photodiodes for detecting lights having different colors in the same line. FIG. 30 shows the schematic structure of a part of the image pick-up section of the linear image sensor according to the eighth embodiment. The linear image sensor shown in FIG. 30 is constituted to include a red/blue diode line 211 having photodiodes R1, R2, ..., Rn for red light detection and photodiodes B1, B2, ..., Bn for blue light detection arranged alternately in a line and a green diode line 212 having photodiodes G1, G2, ..., G2n-1 and G2n for green light detection arranged in a line. The green diode line 212 is provided with a shift of an approximately ½ pitch in the vertical direction of the photodiode from the red/blue diode line 211.

Vertical transfer channels 21a to 2(2n)a constituting a vertical transfer section for transferring signal charges detected by the photodiodes R1 to Rn, G1 to Gn and B1 to Bn included in the red/blue diode line 211 and the green diode line 212 are formed close to the photodiodes R1 and G1, B1 and G2, R2 and G3, ..., Rn and Gn-1, and Bn and G2n respectively and take a winding shape extended in a vertical direction.

The signal charges read from the corresponding photodiodes in a predetermined timing respectively are transferred to a horizontal transfer channel 30 through a vertical and horizontal transfer region 40 and are transferred and output in a horizontal direction. In this example, the signal charges are read onto the horizontal transfer channel 30 with a relative positional relationship shown in FIG. 30.

A color signal for each photodiode to be output corresponds to each color signal in a detection position shown in FIG. 16. In the case in which the color signal is to be utilized as a color image signal, signals having three colors of R, G and B are required. Therefore, a color signal in a portion which is not detected as shown in FIG. 17 is obtained by an interpolation. As is apparent from FIG. 17, moreover, the G signal is shifted by an approximately ½ pitch from the R signal and the B signal. For this reason, a correction processing is further carried out to make the RGB signal shown in FIG. 3. Such an image signal processing is carried out on the outside of the linear image sensor. Moreover, a processing method is not restricted to this method.

Ninth Embodiment

Figure 31:
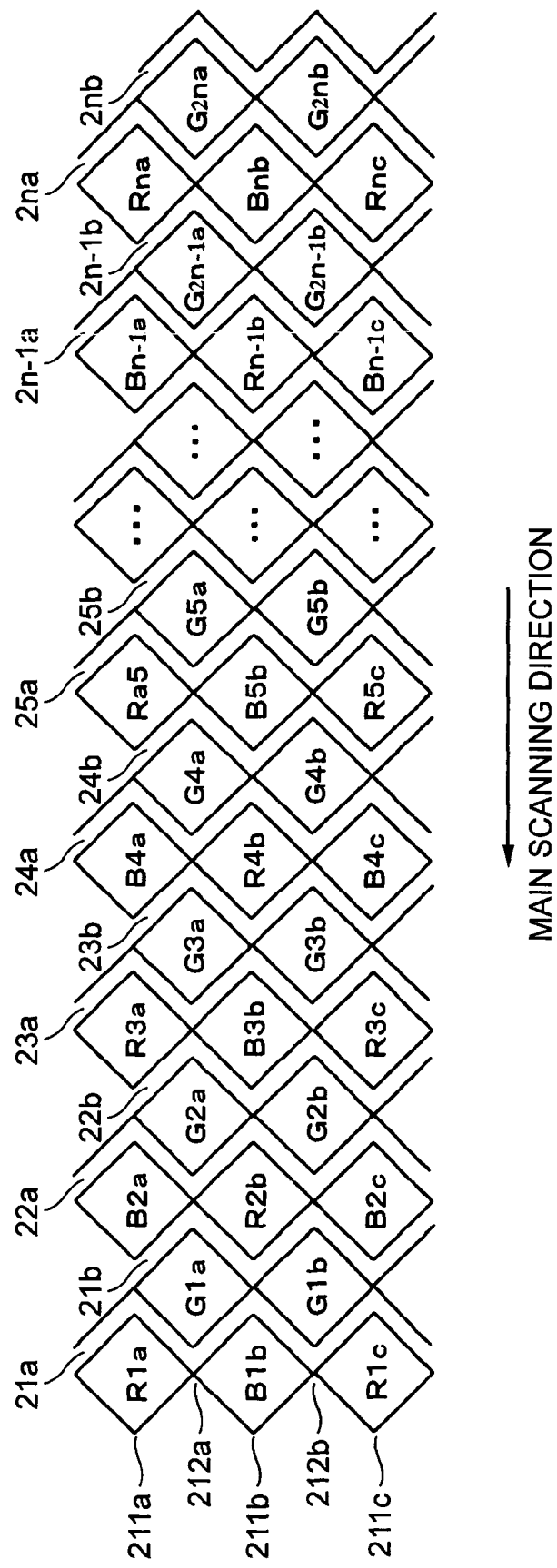
FIG. 31 shows the schematic structure of a part of the image pick-up section of a linear image sensor according to a ninth embodiment.
Figure 36:
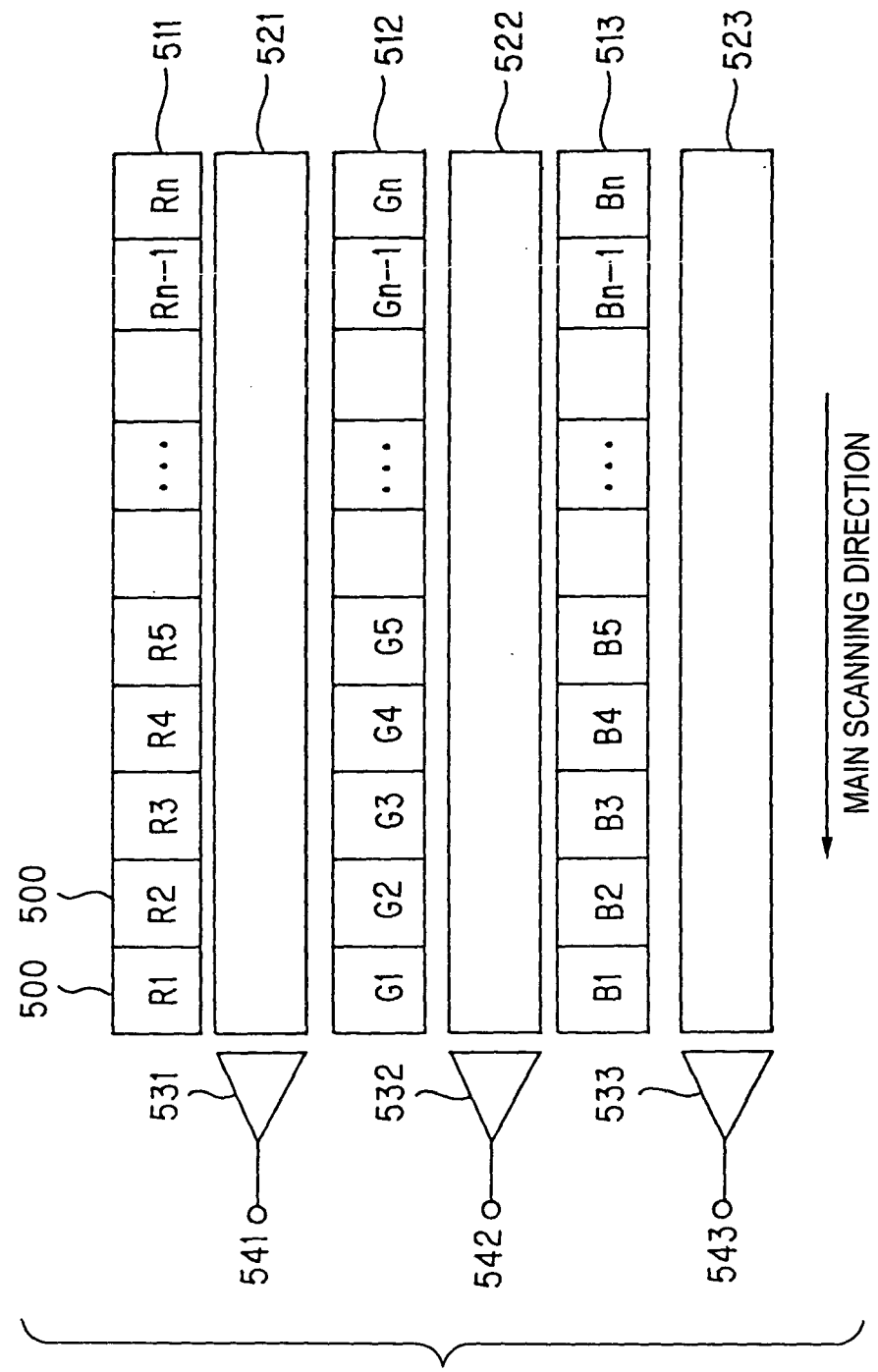
FIG. 36 is a view showing a schematic structure according to a conventional linear image sensor for color image pick-up.
Figure 38:
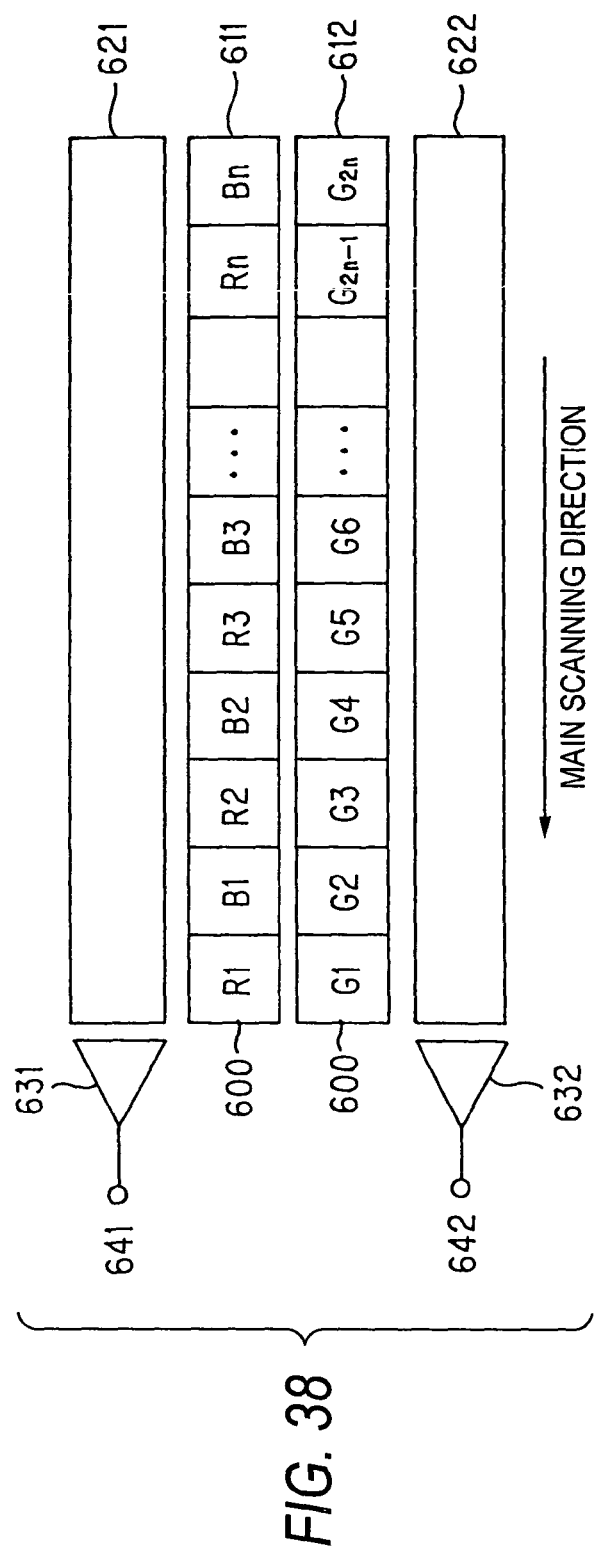
FIG. 38 is a view showing a schematic structure according to another conventional linear image sensor for color image pick-up.

FIG. 31 shows the schematic structure of a part of the image pick-up section of a linear image sensor according to a ninth embodiment. The linear image sensor in FIG. 31 includes a red/blue diode line and a green diode line in the same manner as the linear image sensor according to the eighth embodiment and is different from the linear image sensor according to the eighth embodiment in that a plurality of diode lines are provided, respectively.

The red/blue diode line includes a red/blue diode line 211a having photodiodes R1a, R3a, ..., Rn-1a for red light detection and photodiodes B2a, B4a, ..., Bna for blue light detection arranged alternately in a line, a red/blue diode line 211b having photodiodes B1b, B3b, ..., Bn-1b for blue light detection and photodiodes R2b, R4b, ..., Rnb for red light detection arranged alternately in a line, and a red/blue diode line 211c having photodiodes R1c, R3c, . . . , Rn-1c for red light detection and photodiodes B2c, B4c, . . . , Bnc for blue light detection arranged alternately in a line, and the red/blue diode line 211b has a different arrangement order of diodes from that of each of the red/blue diode lines 211a and 211c.

The green diode line includes a green diode line 212a having photodiodes G1a, G2a, . . . , G2n-1a and G2na for green light detection arranged in a line and a green diode line 212b having photodiodes G1b, G2b, . . . G2n-1b and G2nb for green light detection arranged in a line. The green diode line 212a is provided between the red/blue diode lines 211a and 211b, and the green diode line 212b is provided between the red/blue diode lines 211b and 211c. Moreover, the green diode lines 212a and 212b are arranged with a shift of an approximately ½ pitch in the vertical direction of the photodiode from the red/blue diode lines 211a, 211b and 211c.

Vertical transfer channels 21a to 2na constituting a vertical transfer section for transferring signal charges detected by the photodiodes included in the red/blue diode lines 211a, 211b and 211c and the green diode lines 212a and 212b are formed close to the photodiodes R1a, B1b and R1c, B2a, R2b and B2c, . . . , Rna, Bnb and Rnc, respectively. Moreover, vertical transfer channels 21b to 2nb are formed close to the photodiodes G1a and G1b, G2a and G2b, . . . , Gna and Gnb respectively and take a winding shape extended in a vertical direction.

The signal charges read from the corresponding photodiodes in a predetermined timing respectively are transferred to a horizontal transfer channel 30 through a vertical and horizontal transfer region 40 and are transferred and output in a horizontal direction. In this example, the signal charges are read onto the horizontal transfer channel 30 with a relative positional relationship shown in FIG. 32 or 33.

A color signal for each photodiode to be output corresponds to each color signal in a detection position shown in FIG. 34. In the case in which the color signal is to be utilized as a color image signal, signals subjected to an addition operation as shown in FIG. 35 is set to be a detection color signal. As is apparent from FIG. 34, moreover, a G signal is shifted by an approximately ½ pitch from an R signal and a B signal. For this reason, a correction processing is further carried out to make the RGB signal shown in FIG. 3. Such an image signal processing is carried out on the outside of the linear image sensor. Moreover, a processing method is not restricted to this method.

In the linear image sensor according to the ninth embodiment, the detection color signal is obtained by adding the signal charges of the photodiodes. Therefore, a detection sensitivity can be increased. As compared with the third embodiment and the fourth embodiment, the number of the lines can be decreased to increase the sensitivity. Since the positions of the photodiodes to be added are distributed, moreover, the artificiality of a color signal can be prevented from being caused by the signal addition.

As is apparent from the above description, according to the invention, it is possible to provide a linear image sensor capable of carrying out photographing with a high resolution and a high sensitivity without requiring a mechanical mechanism having high precision.

What is claimed is:

1. An image sensor including a plurality of photoelectric converting device lines, each of which has a plurality of photoelectric converting devices provided linearly on a semiconductor substrate on a main scanning direction, comprising:

an electric charge transfer section to receive and transfer an electric charge from each of the photoelectric converting devices; and an output section to output a signal corresponding to the electric charges transferred by the electric charge transfer section, wherein the plurality of photoelectric converting devices included in each of the photoelectric converting device lines are shifted by approximately ½ pitch in the main scanning direction with the plurality of photoelectric converting devices of an adjacent photoelectric converting device line, wherein the electric charge transfer section includes a plurality of electric charge transfer channels formed on the semiconductor substrate corresponding to each of the photoelectric converting device lines and the electric charge transfer section also includes a plurality of electric charge transfer electrodes formed to cross each of the electric charge transfer channels as seen on a plane, wherein each electric charge transfer channel is formed close to the plurality of photoelectric converting devices to take a winding shape extended in the main scanning direction, wherein the plurality of photoelectric device lines include one or more single color photoelectric device lines, wherein each single color photoelectric device line is configured to detect electric charges corresponding to a same single color light, wherein an even number of photoelectric converting device lines corresponding to the same single color light are provided adjacent to each other, and wherein electric charge transfer paths corresponding to two of the adjacent photoelectric converting device lines corresponding to the same single color light are connected before the output section.

2. An image sensor including a plurality of photoelectric converting device lines, each of which has a plurality of photoelectric converting devices provided linearly on a semiconductor substrate on a main scanning direction, comprising:

an electric charge transfer section to receive and transfer an electric charge from each of the photoelectric converting devices; and an output section to output a signal corresponding to the electric charges transferred by the electric charge transfer section, wherein the plurality of photoelectric converting devices included in each of the photoelectric converting device lines are shifted by approximately ½ pitch in the main scanning direction with the plurality of photoelectric converting devices of an adjacent photoelectric converting device line, wherein the electric charge transfer section includes a plurality of electric charge transfer channels formed on the semiconductor substrate corresponding to each of the photoelectric converting device lines and the electric charge transfer section also includes a plurality of electric charge transfer electrodes formed to cross each of the electric charge transfer channels as seen on a plane, wherein each electric charge transfer channel is formed close to the plurality of photoelectric converting devices to take a winding shape extended in the main scanning direction, wherein the plurality of photoelectric device lines include one or more single color photoelectric device lines, wherein each single color photoelectric device line is configured to detect electric charges corresponding to a same single color light, wherein an even number of photoelectric converting device lines corresponding to the same single color light are provided adjacent to each other, and wherein the electric charge transfer section is provided between two of the adjacent photoelectric converting device lines corresponding to the same single color light so as to be used in the two adjacent lines.

3. The image sensor according to claim 2, wherein the same single color light is one of a red light, a green light and a blue light.

4. An image sensor including a plurality of photoelectric converting device lines, each of which has a plurality of photoelectric converting devices provided linearly on a semiconductor substrate on a main scanning direction, comprising:

an electric charge transfer section to receive and transfer an electric charge from each of the photoelectric converting devices; and an output section to output a signal corresponding to the electric charges transferred by the electric charge transfer section, wherein the plurality of photoelectric converting devices included in each of the photoelectric converting device lines are shifted by approximately ½ pitch in the main scanning direction with the plurality of photoelectric converting devices of an adjacent photoelectric converting device line, wherein the electric charge transfer section includes a plurality of electric charge transfer channels formed on the semiconductor substrate corresponding to each of the photoelectric converting device lines and the electric charge transfer section also includes a plurality of electric charge transfer electrodes formed to cross each of the electric charge transfer channels as seen on a plane, wherein each electric charge transfer channel is formed close to the plurality of photoelectric converting devices to take a winding shape extended in the main scanning direction, and wherein the plurality of photoelectric converting device lines include one or more single color light photoelectric converting device lines and one or more multi-color light photoelectric converting device lines, wherein each single color photoelectric converting device line is configured to detect a single color light and each multi-color photoelectric converting device line is configured to detect at least two color lights.

5. The image sensor according to claim 4, wherein each single color light photoelectric converting device line and each multi-color light photoelectric converting device line are arranged alternately, and wherein a number of the multi-color light photoelectric converting device lines is greater than a number of the single color light photoelectric converting device lines.

6. The image sensor according to claim 5, wherein the color light detected by each single color photoelectric converting device line is a green light, wherein the at least two color lights detected by each multi-color photoelectric converting line include a red color and a blue color, and wherein for each multi-color photoelectric converting device line, each of the photoelectric converting devices for the red light detection are alternately placed with each of the photoelectric converting devices for the blue light detection the main scanning direction.

7. The image sensor according to claim 4, wherein each single color light photoelectric converting device line is adjacent to at least one multi-color light photoelectric converting device line, and wherein a number of the multi-color light photoelectric converting device lines is substantially equal to a number of the single color light photoelectric converting device lines.

8. The image sensor according to claim 4, wherein the plurality of photoelectric converting devices included in each of the photoelectric converting device lines are shifted by approximately ½ pitch in a direction orthogonal to the main scanning direction with the plurality of photoelectric converting devices of an adjacent photoelectric converting device line.

9. An image sensor including a plurality of photoelectric converting device lines, each of which has a plurality of photoelectric converting devices provided linearly on a semiconductor substrate on a main scanning direction, comprising:

a first electric charge transfer section configured to receive and transfer an electric charge from each of the plurality of photoelectric converting devices in a direction orthogonal to the main scanning direction;

a second electric charge transfer section configured to receive and transfer electric charges from the first electric charge transfer section in the main scanning direction; and an output section for outputting a signal corresponding to the electric charges transferred by the second electric charge transfer section, wherein the plurality of photoelectric converting devices included in each of the photoelectric converting device lines are shifted by approximately ½ pitch in the main scanning direction with the plurality of photoelectric converting devices of an adjacent photoelectric converting device line, wherein the first electric charge transfer section includes a plurality of first electric charge transfer channels formed on the semiconductor substrate, each first electric charge transfer channel configured to receive and transfer electric charges from at least one photoelectric converting device of each photoelectric converting device line and the first electric charge section also includes a plurality of first electric charge transfer electrodes formed to cross each of the first electric charge transfer channels as seen on a plane, wherein each first electric charge transfer channel is formed close to the photoelectric converting device to take a winding shape extended in the direction orthogonal to the main scanning direction, wherein four first electric charge transfer electrodes are provided corresponding to the photoelectric converting devices, wherein the plurality of photoelectric device lines include one or more single color photoelectric device lines, wherein each single color photoelectric device line is configured to detect electric charges corresponding to a same single color light, and wherein an even number of photoelectric converting device lines corresponding to the same single color light are provided adjacent to each other.

10. The image sensor according to claim 9, wherein the same single color light is one of a red light, a green light and a blue light.

11. An image sensor including a plurality of photoelectric converting device lines, each of which has a plurality of photoelectric converting devices provided linearly on a semiconductor substrate on a main scanning direction, comprising:

a first electric charge transfer section configured to receive and transfer an electric charge from each of the plurality of photoelectric converting devices in a direction orthogonal to the main scanning direction;

a second electric charge transfer section configured to receive and transfer electric charges from the first electric charge transfer section in the main scanning direction; and an output section for outputting a signal corresponding to the electric charges transferred by the second electric charge transfer section, wherein the plurality of photoelectric converting devices included in each of the photoelectric converting device lines are shifted by approximately ½ pitch in the main scanning direction with the plurality of photoelectric converting devices of an adjacent photoelectric converting device line, wherein the first electric charge transfer section includes a plurality of first electric charge transfer channels formed on the semiconductor substrate, each first electric charge transfer channel configured to receive and transfer electric charges from at least one photoelectric converting device of each photoelectric converting device line and the first electric charge section also includes a plurality of first electric charge transfer electrodes formed to cross each of the first electric charge transfer channels as seen on a plane, wherein each first electric charge transfer channel is formed close to the photoelectric converting device to take a winding shape extended in the direction orthogonal to the main scanning direction, wherein four first electric charge transfer electrodes are provided corresponding to the photoelectric converting devices, and wherein the plurality of photoelectric converting device lines include one or more single color light photoelectric converting device lines and one or more multi-color light photoelectric converting device lines, wherein each single color photoelectric converting device line is configured to detect a single color light and each multi-color photoelectric converting device line is configured to detect at least two color lights.

12. The image sensor according to claim 11, wherein each single color light photoelectric converting device line and each multi-color light photoelectric converting device line are arranged alternately, and wherein a number of the multi-color light photoelectric converting device lines is greater than a number of the single color light photoelectric converting device lines.

13. The image sensor according to claim 12, wherein wherein the color light detected by each single color photoelectric converting device line is a green light, wherein the at least two color lights detected by each multi-color photoelectric converting line include a red color and a blue color, and wherein for each multi-color photoelectric converting device line, each of the photoelectric converting devices for the red light detection are alternately placed with each of the photoelectric converting devices for the blue light detection in the main scanning direction.

14. The image sensor according to claim 11, wherein each single color light photoelectric converting device line is adjacent to at least one multi-color light photoelectric converting device line, and wherein a number of the multi-color light photoelectric converting device lines is substantially equal to a number of the single color light photoelectric converting device lines.

15. The image sensor according to claim 11, wherein the plurality of photoelectric converting devices included in each of the photoelectric converting device lines are shifted by approximately ½ pitch in a direction orthogonal to the main scanning direction with the plurality of photoelectric converting devices of an adjacent photoelectric converting device line.

16. An image sensor for sensing an image, comprising:

a plurality of photoelectric converting device lines, each photoelectric converting device line comprising a plurality of photoelectric converting devices configured to detect light colors of the image, the plurality of photoelectric converting devices arranged linearly on a semiconductor substrate on a main scanning direction;

an electric charge transfer section configured to receive an electric charge from each photoelectric converting device and transfer the electric charges in the main scanning direction to an output section; and the output section configured to output a signal corresponding to the electric charges transferred by the electric charge transfer section, wherein the plurality of photoelectric converting devices of each photoelectric converting device line is shifted by approximately ½ pixel pitch in the main scanning direction, a direction orthogonal to the main scanning direction, or both with the plurality of photoelectric converting devices of an adjacent photoelectric converting device line, wherein the electric charge transfer section includes a plurality of electric charge transfer channels formed on the semiconductor substrate corresponding to each of the photoelectric converting device lines and the electric charge transfer section also includes a plurality of electric charge transfer electrodes formed to cross each of the electric charge transfer channels, wherein each electric charge transfer channel is formed adjacent to the plurality of photoelectric converting devices to take a winding shape extended in the main scanning direction, and wherein the image sensor senses a plurality of colors and a number of the photoelectric converting devices sensing each of the plurality of colors is approximately equal.

17. The image sensor according to claim 16, wherein the plurality of electric charge transfer electrodes are formed between the plurality of photoelectric converting devices to take a winding shape extended in the direction orthogonal to the main scanning direction.

18. The image sensor according to claim 16, wherein the plurality of electric charge transfer electrodes comprises four electric charge transfer electrodes corresponding to each of the plurality of photoelectric converting devices.

19. The image sensor according to claim 16, wherein each of the plurality of photoelectric converting device lines is configured to detect one color of the plurality of colors.

20. The image sensor according to claim 19, wherein two adjacent photoelectric converting device lines are configured to detect a same color of the plurality of colors.

21. The image sensor according to claim 20, wherein the two adjacent photoelectric converting device lines are each configured to transfer electric charges corresponding to the same color to respectively separate electric charge transfer channels.

22. The image sensor according to claim 20, wherein the two adjacent photoelectric converting device lines are configured to transfer electric charges corresponding to the same color to a same electric charge transfer channel.

23. The image sensor according to claim 16, wherein the plurality of colors include red, green and blue colors.

24. A image sensor for sensing an image, comprising:
a plurality of photoelectric converting device lines, each photoelectric converting device line comprising a plurality of photoelectric converting devices configured to detect light colors of the image, the plurality of photoelectric converting devices arranged linearly on a semiconductor substrate in a main scanning direction;
a first electric charge transfer section configured to receive an electric charge from each photoelectric converting device and transfer the electric charges in a direction orthogonal to the main scanning direction;
a second electric charge transfer section configured to receive the electric charges from the first electric charge transfer section and transfer the electric charges in the main scanning direction to an output section; and
the output section configured to output a signal corresponding to the electric charges transferred by the second electric charge transfer section,
wherein the plurality of photoelectric converting devices of each photoelectric converting device line is shifted by approximately ½ pixel pitch in the main scanning direction, the direction orthogonal to the main scanning direction, or both with the plurality of photoelectric converting devices of an adjacent photoelectric converting device line,
wherein the first electric charge transfer section includes
a plurality of first electric charge transfer channels formed on the semiconductor substrate, each first electric charge transfer channel configured to receive and transfer electric charges from at least one photoelectric converting device of each photoelectric converting device line, and
a plurality of first electric charge transfer electrodes formed to cross each of the first electric charge transfer channels as seen on a plane,
wherein the first electric charge transfer section includes a plurality of electric charge transfer channels formed on the semiconductor substrate corresponding to each of the photoelectric converting device lines and the electric charge transfer section also includes a plurality of first electric charge transfer electrodes formed to cross each of the electric charge transfer channels,
wherein each electric charge transfer channel is formed adjacent to the plurality of photoelectric converting devices to take a winding shape extended in the direction orthogonal to the main scanning direction, and
wherein the image sensor senses a plurality of colors and a number of the photoelectric converting devices sensing each of the plurality of colors is approximately equal.

25. The image sensor according to claim 24, wherein the plurality of first electric charge transfer electrodes are formed between the photoelectric converting devices to take a winding shape extended in the main scanning direction.

26. The image sensor according to claim 24, wherein the plurality of first electric charge transfer electrodes comprises four first electric charge transfer electrodes corresponding to each of the plurality of photoelectric converting devices.

27. The image sensor according to 24, wherein each of the plurality of photoelectric converting device lines is configured to detect one color of the plurality of colors.

28. The image sensor according to claim 27, wherein two adjacent photoelectric converting device lines are configured to detect a same color of the plurality of colors.

29. The image sensor according to claim 28, wherein the two adjacent photoelectric converting device lines are each configured to transfer electric charges corresponding to the same color to respectively separate electric charge transfer channels.

30. The image sensor according to claim 28, wherein the two adjacent photoelectric converting device lines are configured to transfer electric charges corresponding to the same color to a same electric charge transfer channel.

31. The image sensor according to claim 24, wherein the plurality of colors include red, green and blue colors.

32. An image sensor, comprising:
a plurality of photodiodes arranged in rows and columns, each photodiode configured to detect a color among a plurality of colors;
an electric charge transfer section configured to receive an electric charge corresponding to the detected color from each photodiode and transfer the electric charges to an output section; and
the output section configured to output a signal corresponding to the electric charges transferred by the electric charge transfer section,
wherein each row of the photodiodes is shifted by ½ pitch in a column direction to the photodiodes of an adjacent row and each column of the photodiodes is shifted by ½ pitch in a row direction to the photodiodes of an adjacent column;
wherein the electric charge transfer section includes plurality of electric charge transfer electrodes forming a plurality of charge transfer channels,
wherein the plurality of charge transfer channels are either arranged in the row direction windingly adjacent to one or more rows of the plurality of photodiodes to transfer the electric charges from the one or more rows of the plurality of photodiodes, or arranged in the column direction windingly adjacent to one or more columns of the plurality of photodiodes to transfer electric charges from one or more columns of the plurality of photo diodes,
wherein the plurality of electric charge transfer electrodes are formed to cross the plurality of charge transfer channels, and
wherein the image sensor senses a plurality of colors and a number of the photoelectric converting devices sensing each of the plurality of colors is approximately equal.

33. The image sensor according to claim 32, wherein the plurality of electric charge transfer electrodes are windingly adjacent to the plurality of photodiodes in a direction orthogonal to the plurality of charge transfer channels.

34. The image sensor according to claim 32, wherein all photodiodes of each row are configured to detect a same color of the plurality of colors.

35. The image sensor according to claim 34, wherein each row of photodiodes is configured to detect a different color of the plurality of colors from an adjacent row of photodiodes.

36. The image sensor according to claim 35, wherein each row of photodiodes has a separate corresponding electric charge transfer channel arranged in the row direction, and the each row of photodiodes is configured to transfer the electric charges to the separate corresponding electric charge transfer channel.

37. The image sensor according to claim 35, further comprising another charge transfer section arranged in the row direction, wherein the plurality of electric charge channels are arranged in the column direction, wherein each of the plurality of electric charge channels receives electric charges from one corresponding column of photodiodes, and wherein the another charge transfer section receives the electric charges from the electric charge transfer channels and transfers the electric charges to the output section.

38. The image sensor according to claim 35, further comprising another charge transfer section arranged in the row direction wherein the plurality of electric charge channels are arranged in the column direction, wherein each of the plurality of electric charge channels receives electric charges from two adjacent columns of photodiodes, and wherein the another charge transfer section receives the electric charges from the electric charge transfer channels and transfers the electric charges to the output section.

39. The image sensor according to claim 34, wherein two adjacent rows of photodiodes are configured to detect a same color of the plurality of colors.

40. The image sensor according to claim 39, wherein the plurality of electric charge transfer channels are arranged in the row direction, and wherein the two adjacent rows are each configured to transfer the electric charges to separate electric charge transfer channels.

41. The image sensor according to claim 39, wherein the plurality of electric charge transfer channels are arranged in the row direction, and wherein the two adjacent rows are both configured to transfer the electric charges to a same electric charge transfer channel.

42. The image sensor according to claim 39, further comprising another charge transfer section arranged in the row direction, wherein the plurality of electric charge channels are arranged in the column direction, wherein each of the plurality of electric charge channels receives electric charges from one corresponding column of photodiodes, and wherein the another charge transfer section receives the electric charges from the electric charge transfer channels and transfers the electric charges to the output section.

43. The image sensor according to claim 39, further comprising another charge transfer section arranged in the row direction, wherein the plurality of electric charge channels are arranged in the column direction, wherein each of the plurality of electric charge channels receives electric charges from two adjacent columns of photodiodes, and wherein the another charge transfer section receives the electric charges from the electric charge transfer channels and transfers the electric charges to the output section.

44. The image sensor according to claim 32, wherein the plurality of colors include red, green and blue colors.

* * * * *